US 6,348,845 B2

(12) United States Patent
Nakamura et al.

(10) Patent No.: US 6,348,845 B2
(45) Date of Patent: Feb. 19, 2002

(54) SURFACE ACOUSTIC WAVE FILTER AND MULTISTAGE SURFACE ACOUSTIC WAVE FILTER

(75) Inventors: Hiroyuki Nakamura, Neyagawa; Toru Yamada, Katano; Kazunori Nishimura, Yawata; Toshio Ishizaki, Kobe, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/794,035

(22) Filed: Feb. 28, 2001

Related U.S. Application Data

(62) Division of application No. 09/390,653, filed on Sep. 7, 1999, which is a division of application No. 08/862,383, filed on May 23, 1997, now Pat. No. 5,990,762.

(30) Foreign Application Priority Data

May 23, 1996 (JP) .............................. 8-128760
Aug. 30, 1996 (JP) .............................. 8-230016
Jan. 14, 1997 (JP) .............................. 9-004894

(51) Int. Cl.[7] ................................. H03H 9/64
(52) U.S. Cl. ................... 333/195; 310/313 D
(58) Field of Search ................... 333/193–196; 310/313 R, 313 B, 313 C, 313 D

(56) References Cited

U.S. PATENT DOCUMENTS

| 4,223,284 A | 9/1980 | Inoue et al. ................ 333/150 |
| 4,575,698 A | 3/1986 | Schofield .................... 333/195 |
| RE33,957 E | 6/1992 | Nakazawa et al. ... 310/313 D X |
| 5,363,073 A | 11/1994 | Higgins, Jr. ................ 333/195 |
| 5,363,074 A | 11/1994 | Higgins, Jr. ................ 333/195 |

(List continued on next page.)

FOREIGN PATENT DOCUMENTS

| DE | 44 39 489 C1 | 1/1996 |
| EP | 0 176 786 A2 | 4/1986 |
| EP | 0 648 015 A2 | 4/1995 |
| EP | 0 740 411 A1 | 10/1996 |
| JP | 53-30848 | 3/1978 |

OTHER PUBLICATIONS

B. Wall and A. du Hamél; "Balanced Driven Transversely Coupled Waveguide Resonator Filters"; *1996 IEEE Utlrasonics Symposium Proceedings*, vol. 1, pp 47–51; Nov. 3–6, 1996; San Antonio, TX.

Toru Yamada, et al., "Balanced IF SAW Filter for Digital Portable Telephone using Transversely Coupled Resonator," "Proceedings of the 1994 IEICE Fall Conference held Sep. 26, 29, 1994, pp. 299–300.

Japanese Office Action dated Dec. 12, 1999 and translation thereof.

*Primary Examiner*—Robert Pascal
*Assistant Examiner*—Barbara Summons
(74) *Attorney, Agent, or Firm*—Smith, Gambrell & Russell, LLP

(57) ABSTRACT

A surface acoustic wave resonator is constituted by an IDT electrode and reflector electrodes disposed on both sides thereof, on a piezoelectric substrate. Two of said surface acoustic wave resonators are disposed nearby so that the propagation directions of the respective surface acoustic waves are in parallel to each other to make acoustic couple to constitute a surface acoustic wave filter having plural exciting modes with different propagation frequencies. The bus bar electrodes of each of two IDT electrodes are electrically separated from each other, and the leading out electrodes led out from at least two spots on those bus bar electrodes are electrically connected to each other, by which one side of the balanced input and output terminal. As a result, the electrode resistance of the IDT electrode is alleviated to make the insertion loss less.

18 Claims, 24 Drawing Sheets

U.S. PATENT DOCUMENTS

| | | | |
|---|---|---|---|
| 5,365,138 A | | 11/1994 | Saw et al. ............ 310/313 B X |
| 5,374,908 A | * | 12/1994 | Wright ........................ 333/195 |
| 5,581,141 A | | 12/1996 | Yamada et al. .......... 333/195 X |
| 5,793,266 A | | 8/1998 | Allen et al. .......... 310/313 D X |
| 5,844,453 A | | 12/1998 | Matsui et al. ................ 333/193 |
| 5,936,487 A | | 8/1999 | Solal et al. .................. 333/193 |
| 6,043,726 A | * | 3/2000 | Solal et al. .................. 333/195 |
| 6,177,752 B1 | * | 1/2001 | Yoshimoto .............. 333/195 X |

FOREIGN PATENT DOCUMENTS

| | | | | |
|---|---|---|---|---|
| JP | 55-107319 | | 8/1980 | |
| JP | 56-22164 | | 5/1981 | |
| JP | 59-131213 | | 7/1984 | |
| JP | 62-142409 | | 6/1987 | |
| JP | 63-285018 | * | 11/1988 | ................. 333/193 |
| JP | 64-54805 | * | 3/1989 | |
| JP | 3-119316 | * | 5/1991 | ................. 333/193 |
| JP | 4-21367 | | 4/1992 | |
| JP | 4-373304 | * | 12/1992 | ................. 333/193 |
| JP | 6-177703 | | 6/1994 | |
| JP | 7-321599 | | 12/1995 | |
| JP | 8-51334 | | 2/1996 | |
| JP | 8-307201 | * | 11/1996 | |
| WO | WO 97-12441 | | 4/1997 | |

* cited by examiner

SURFACE ACOUSTIC WAVE FILTER AND MULTISTAGE SURFACE ACOUSTIC WAVE FILTER

This application is a division of application Ser. No. 09/390,653 filed Sep. 7, 1999, which is a division of application Ser. No. 08/862,383 filed May 23, 1997, now U.S. Pat. No. 5,990,762, both documents included herein in their entirety by reference thereto.

BACKGROUND OF THE INVENTION

1. Field of the Invention

The present invention relates to a surface acoustic wave filter to be used for a high frequency wave circuit or the like in, for example, a radiocommunication apparatus.

2. Related Art of the Invention

The electromechanical function parts using surface acoustic wave (SAW) have been noted with current attention in the hardware high density because the acoustic velocity of the wave is several kilometers/second, and the wave energy has properties to be concentrated on the surface of the propagation medium. Due to the development of the inter-digital transducer (IDT) electrode and progress of the thin film preparing technique which has made its modified development possible, the same has been practically utilized for delay lines for radar, band-pass filters for television receiver, etc. At present, the SAW is extensively used as RF and IF stage filters for receiving and transmitting circuits in radio-communication apparatus.

In recent years, in consequence of the adoption of digital systems for moving objects, development of digital portable telephone and digital cordless telephone is intense. As the communication systems to be used for these apparatuses have information on the amplitude and phase of signals, the flatness of amplitude characteristics and group delay deflection characteristics are required for the filters to be used for IF stage. Also, as the excellent characteristic is required for the selectivity to distinguish the signal of an adjacent channel and the desired signal, an acute attenuation characteristic having narrow transition bandwidth is also an essential condition. Also, recently, balanced input and output of the IC device in the stage before and after the IF filter have progressed, and the balanced input and output are required for the IF filter.

Conventionally, as a SAW filter suitable for the IF stage there are known a transversal SAW filter and two kinds of longitudinal mode coupled and transverse mode coupled type SAW filters. The transversal SAW filter has an excellent group delay deflection characteristic, but it has large insertion loss, poor attenuation characteristic, and large element size. On the other hand, the mode coupled type SAW filter presents an acute attenuation characteristic, shows small insertion loss, and is small in element size, but its group delay deflection characteristic is inferior to that of a transversal type SAW filter. The longitudinal mode type SAW is characterized by having a relatively large spurious zone on the high band side in the vicinity of the passing band, and the transverse mode type SAW filter is characterized by having a very narrow band characteristic. In view of the above characteristics, as the IF filter for the mobile communication apparatus the transverse mode coupled type SAW filter which is miniature in size and excellent in attenuation characteristic has been widely used.

Hereinafter, explanation is made on the conventional transverse mode coupled type SAW filter.

FIG. 24 is a constitution view showing a transverse mode coupled resonator type SAW filter according to conventional technique. In FIG. 24, the part 241 is a single crystal piezoelectric substrate. By forming an electrode pattern on the piezoelectric substrate 241, the SAW can be excited. The part 242a is an IDT electrode formed on the piezoelectric substrate 241, and by setting the reflector electrodes 242b and 242c on both sides thereof, an energy sealing in type SAW resonator is formed. On the piezoelectric substrate 241, there is formed a similar SAW resonator by the IDT electrode 243a and the reflector electrodes 243b and 243c. And, these two resonators are disposed nearby, and because of the formation of an acoustic couple between them, the SAW filter is constituted.

In the SAW filter constituted as above, two kinds of SAW mode frequencies to be excited on the piezoelectric substrate are determined by the electrode finger crossing width of IDT electrodes and the distance between the two SAW resonators disposed nearby, and the passing band width of the filter is determined.

In the SAW filter constituted as above, the bandwidth that can be realized is very narrow, and the specific bandwidth of the filter to be realized (normalized bandwidth at the central frequency of the filter) is at most about 0.1%. In order to meet the recent digital system, it is required to make the filter passing characteristics of wider bandwidth and broaden the flat bandwidth of the group delay deflection characteristic.

Also, recently a balanced input and output of IC device in the pre- and post-stages of IF filter have progressed. Accordingly, a balanced input and output type is strongly demanded for the IF filters. However, as shown in FIG. 24, in the conventional SAW filters, the one side of the electrode fingers of input and output stages of the IDT electrodes 242a, 243a is grounded, and there is a problem that the filter cannot be formed in a balanced input and output type.

Furthermore, there has been desired the impedance matching between the IF filter and the IC devices in the pre- and post-stages thereof, and as the input and output impedance's of the conventional filters depend on the number of pairs of the electrode fingers included in the IDT electrodes which are closely related with the filter characteristic, there has been a problem of it being difficult to obtain the desired impedance value simultaneously with obtaining the desired filter characteristic.

SUMMARY OF THE INVENTION

The present invention is to settle the above problems in the prior art, and its objects are (1) to realize a balanced type input and output constitution and to improve balancing extent of the balanced type terminal in the input and output terminal and realize low insertion loss, (2) to make the pass band wide width, and to make the phase and amplitude characteristics flat, and (3) to provide a SAW filter having the desired input and output impedances.

In order to attain the above objects, the SAW filter of the present invention comprises first and second surface acoustic wave resonators each having a reflector electrode on both sides of an IDT electrode as an inter-digital transducer electrode, said resonators being disposed nearby in positions in which directions of propagation of the respective surface acoustic waves are parallel with each other and acoustically coupled, an inside bus bar electrode included in the first IDT electrode of the first surface acoustic wave resonator and an inside bus bar electrode included in the second IDT electrode of the second surface acoustic wave resonator being mutually electrically separated, said first IDT electrode being connected to a balanced type input terminal, and said second IDT electrode being connected to a balanced type output terminal, one terminal of said balanced type input terminal being electrically connected to leading out electrodes led out directly or indirectly from at least two places of the inside bus bar electrode of said first IDT electrode, and one terminal of said balanced type output terminal being electrically connected to leading out electrodes led out directly or indirectly from at least two places of the inside bus bar electrode of said second IDT electrode, thereby performing balanced operation.

By this constitution, there can be obtained, for example, a basic electrode pattern of SAW filter having a balanced type input and output terminal having low insertion loss and favorable balancing level.

Also, in order to settle the problems mentioned above, the SAW filter of the present invention comprises first and third surface acoustic wave resonators each having a reflector electrode on both sides of an IDT electrode as an inter-digital transducer electrode, said resonators being disposed on a piezoelectric substrate in positions in which directions of propagation of the respective surface acoustic waves are parallel with each other, a plurality of strip line electrodes being disposed in parallel between said first and third surface acoustic wave resonators in the same electrode period as those of the first and third surface acoustic wave resonators, said plural strip line electrodes being connected one another by bus bar electrodes to form a second surface acoustic wave resonator having periodic structured electrode rows, said first and third surface acoustic wave resonators being disposed nearby to said second surface acoustic wave resonator to make acoustic couple, and the adjacent bus bar electrodes between said surface acoustic wave resonators being electrically separated, and all periodic structured electrodes of said second surface acoustic wave resonators being grounded, assuming that an electrode finger crossing width of IDT electrodes constituting the first and third surface acoustic wave resonators to be W1, and a strip line length of said periodic structured electrode rows constituting the second surface acoustic wave resonator to be W2, the relative size of W1 to W2 being set to $1 \leq W2/W1$.

By this constitution, the distance between the three resonance frequencies becomes equal, and when the input and output coordination is obtained, the ripples in the pass band decrease to give excellent pass characteristics. As a result, there can be obtained the SAW filter having broad bandwidth and flat pass characteristics and acute attenuation characteristics.

Furthermore, in order to solve the above problems, the SAW filter of the present invention comprises at least two surface acoustic wave resonators each having a reflector electrode on both sides of an IDT electrode as an inter-digital transducer electrode, at least two of said resonators being disposed on a piezoelectric substrate in positions nearby to one another in which directions of propagation of the respective surface acoustic waves are parallel with one another to make acoustic couple, characterized in that, of plural electrode fingers included in at least one IDT electrode, at least a couple of adjacent electrode fingers are in reverse phase relations to each other, and said plural electrode fingers are connected so as not to cancel the respective electric charges.

By this constitution, there can be obtained an SAW filter having the desired input and output impedance.

As described above, according to this invention, it is possible to provide a compact SAW filter which shows the smaller insertion loss than the conventional one, improved balancing level in the balanced type input and output terminal, or, which can be provided with flat filter pass characteristic and good extra-band attenuation characteristic, or which has the desired input and output impedance.

DESCRIPTION OF THE PREFERRED EMBODIMENTS

Hereinafter, preferred embodiments of the present invention will be illustrated with reference to the drawings.

(Embodiment 1)

Figure 1:
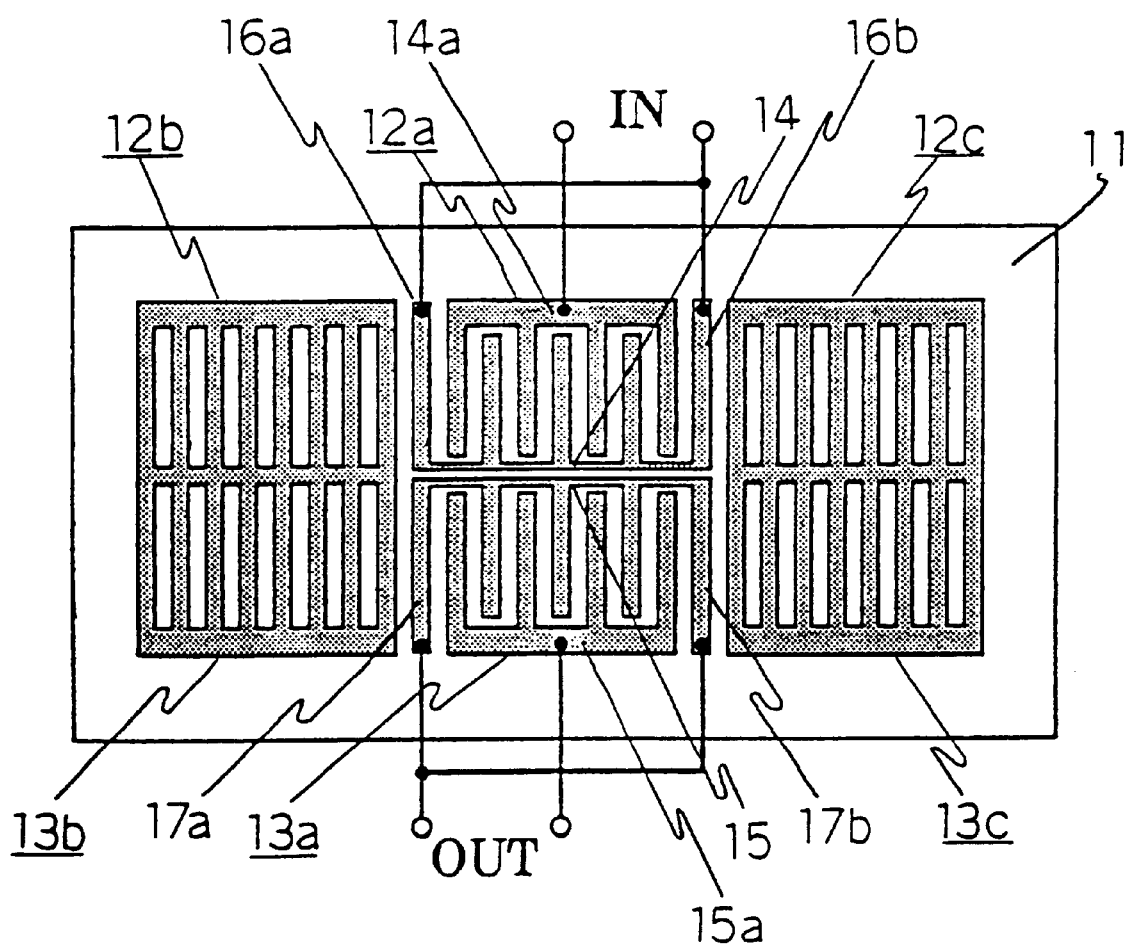
FIG. 1 is a constitution view showing a SAW filter according to the first embodiment of the present invention.

FIG. 1 is a constitution view showing a SAW filter according to the first embodiment of the present invention. By forming an electrode pattern having a strip line shaped periodical structure on a single crystal piezoelectric substrate 11 shown in FIG. 1, SAW can be excited. On the piezoelectric substrate 11 there is formed a first SAW resonator of energy stage type constituted by an IDT electrode 12a and reflector electrodes 12b, 12c. Also, on the piezoelectric substrate 11, there is constituted a second SAW resonator of constituted by an IDT electrode 13a and reflector electrodes 13b, 13c. And, these two SAW resonators are disposed close to each other, and by formation of acoustic couple between them, a SAW filter is constituted.

Figure 24:
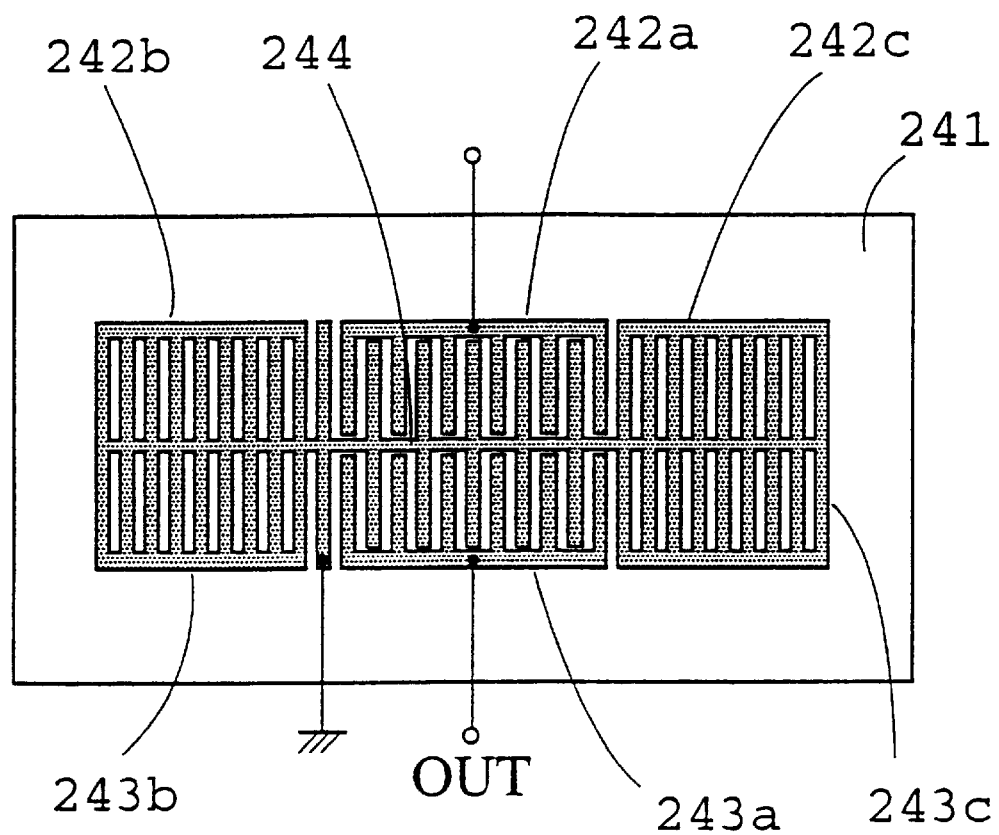
FIG. 24 is an electrode pattern diagram of conventional SAW filter.

A remarkable difference in the electrode pattern constitutions between the SAW filter of the first embodiment of the present invention shown in FIG. 1 and that of prior art as shown in FIG. 24 is that the bus bar electrodes 244 common to the two resonators disposed nearby of conventional style in FIG. 24 are electrically separated in the IDT electrode part into the inside first bus bar 14 and the second bus bar 15 in the first embodiment of the present invention. The first bus bar 14 belongs to the first SAW resonator, and the second bus bar 15 to the second SAW resonator. By this bus bar separation constitution, the first and second SAW resonators can have fully electrically independent input or output stages. Namely, the balanced input stage of the first SAW resonator is constituted by an electrode finger formed by being bound by the first bus bar electrode 14 and an IDT electrode 12a comprising an electrode finger to be coupled with said electrode finger. In the same manner, the balanced output stage of the second SAW resonator is constituted by an IDT electrode 13a comprising an electrode finger formed by being bound by the second bus bar electrode 15 and an electrode finger to be coupled with said electrode finger. Here, the first IDT electrode of the present invention corresponds to the IDT electrode 12a. The second IDT electrode of the present invention corresponds to the IDT electrode 13a.

The connection of the signal line to the balanced circuit constituted as above may be made to apply an input signal to the spot between the first bus bar electrode 14 and the third bus bar electrode 14a positioned outside the IDT electrode to be coupled therewith, and to take out the output signal from the spot between the second bus bar electrode 15 and the fourth bus bar electrode 15a positioned outside the IDT electrode to be coupled therewith. By this step, the object of balancing the input and output terminals has been attained. When this is observed from the aspect of the insertion loss, the amount is about 3.2 dB in the case of the above connection.

With respect to one terminal of the balanced type input terminal described above, a connection line is led from one spot of the first bus bar electrode 14, and as to the one terminal in the balanced type output terminals, explanation has been given on the case where a connection line is led from one spot of the second bus bar electrode 15. Against this, the case of the constitution leading out the connection lines from the two spots of the first and second bus bar electrodes 14, 15 is described next.

With respect to this insertion loss, by leading out two connection lines (leading out electrode fingers 16a, 16b) from two spots of the first bus bar electrode 14 to make a terminal of the input side, and leading out two connection lines (leading out electrode fingers 17a, 17b) from two spots of the second bus bar electrode 15 to make a terminal of the output side, improvement of the balancing level in the balanced type input and output terminal is realized, the difference of loss formed in each terminal is decreased to reduce the above insertion loss to a large extent to about 2.8 dB. This is an effect having an important value in a miniature type portable communication apparatus which weighs as being important in the minor loss and a balance level in the balanced type input and output terminal. In other words, in FIG. 1, from both ends of the first bus bar electrode 14, the leading out electrode fingers 16a, 16b directed outward are formed on the space between the IDT electrode 12a and the reflector electrodes 12b, 12c, and by connecting the end parts of these electrode fingers as illustrated, the effect as mentioned above is obtained. The leading out electrode fingers 17a, 17b at both ends of the second bus bar electrode 15 also have the same effect. The leading out electrode fingers 16a, 16b can be regarded as being constituted by the electrode fingers having the same length as other electrode fingers which are connected to the two end parts of the first bus bar electrode 14 and the leading out electrodes of short length connected to the front end parts of those two electrode fingers. The same comments can be made on the leading out electrode fingers 17a, 17b.

Figure 2:
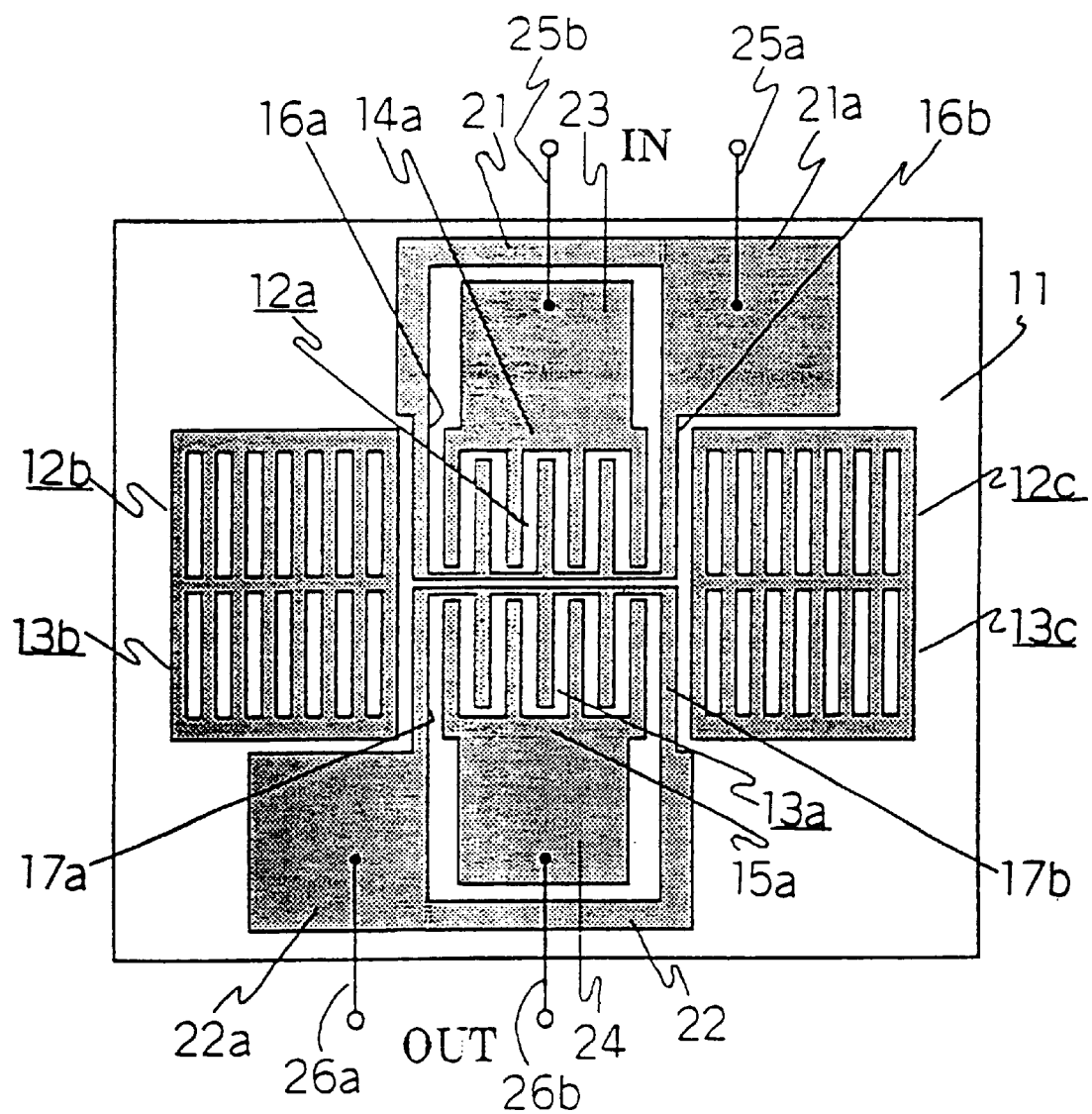
FIG. 2 is a constitution view showing another example of SAW filter according to the first embodiment of the present invention.

FIG. 2 shows an example of variations of the first embodiment of the present invention shown in FIG. 1. To the parts which perform the same functions as those given in FIG. 1 the same marks are affixed and explanations thereon are omitted.

The wiring pattern 21 to connect between the leading electrode fingers 16a and 16b is formed on the piezoelectric substrate 11 and has a line width wider than the resonator electrode. A part of it is further expanded as shown in FIG. 2 to form a one connection land 21a for connecting between the balanced type input and output terminals and the outside wiring member 25a.

The wiring pattern 22 for connecting between the leading out electrode fingers 17a and 17b is formed on the piezoelectric substrate 11, and has a line width wider than the resonator electrode width. A part of it is further expanded, as shown in the same figure, to form one connection land 22a for the connection line between the balanced type output terminal and the outside wiring member 26a.

The bus bar electrode 14a is extended outward to form another connection land 23 for connecting between the balanced type output terminal and the outside wiring member 25b. The bus bar electrode 15a is also extended outward to form another connection land 24 for connecting between the balanced type output terminal and the outside wiring member 26b.

The above constitution is effective for assuring the characteristics of low insertion loss and good balanced level of the SAW filter having low insertion loss and balanced type input and output terminals, and for stabilizing the filter characteristics.

Taking an example of a SAW filter of single stage constitution, explanation has been given above by referring to FIG. 1 and FIG. 2. Such SAW filter can be used in multi-stage constitution.

Figure 3:
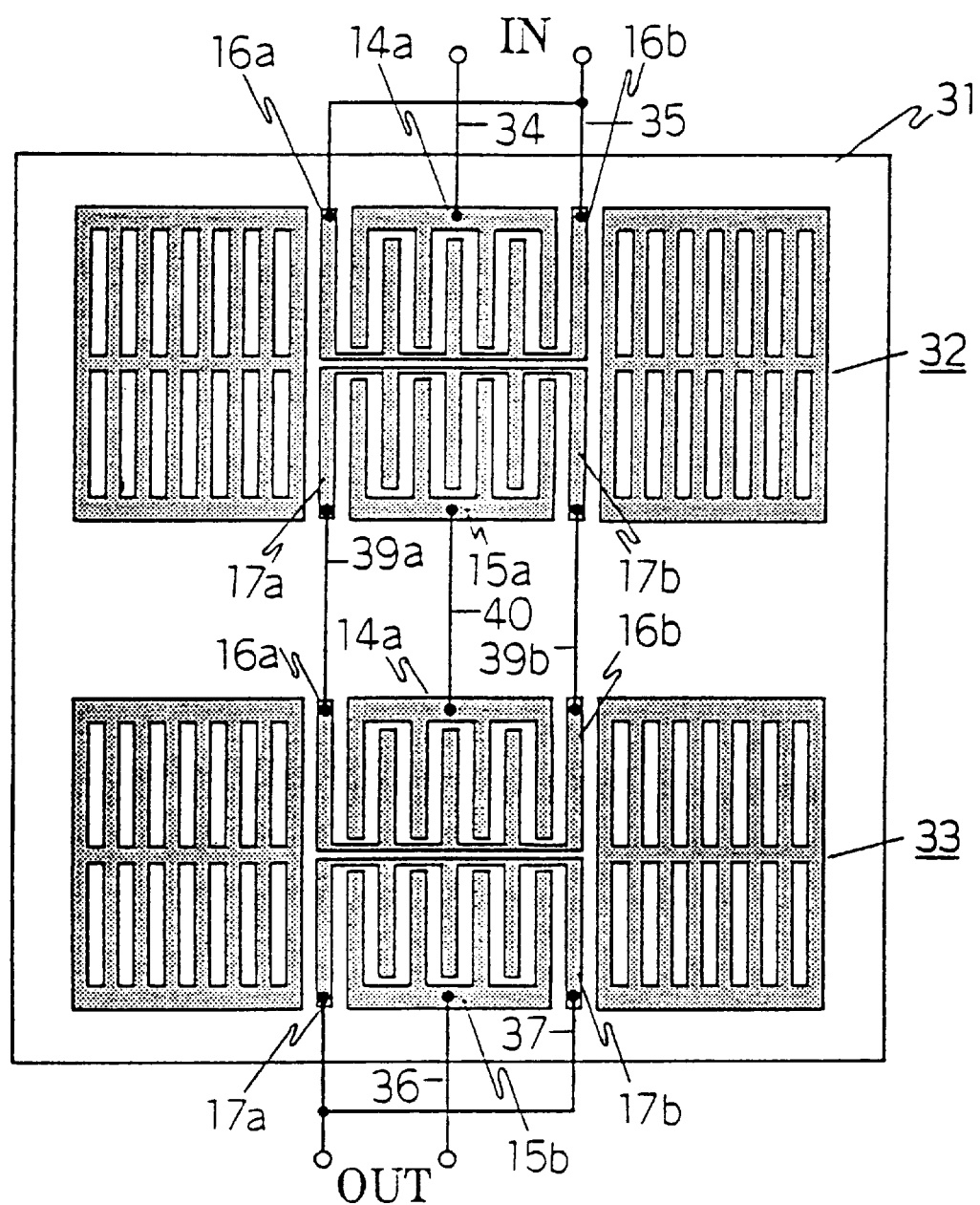
FIG. 3 is a constitution view showing a multi-stage SAW filter according to the first embodiment of the present invention.

FIG. 3 is an example thereof, and when a multi-stage connection SAW filter is constituted by connecting a plurality of SAW filters on the same piezoelectric substrate 31, great improvement can be obtained in the characteristics in the rejection band and transition band, though there may be some increase in the insertion loss. The two-stage vertically (cascade) connected filters shown in FIG. 3 comprise a first SAW resonator constituted by an IDT electrode 12a and reflector electrodes 12b, 12c as explained in FIG. 1, and a second SAW resonator constituted by an IDT electrode 13a and a reflector electrodes 13b, 13c, which are disposed near to each other to form a SAW filter 32 and a SAW filter 33 of the same constitution thereof formed on the piezoelectric substrate 31, and the two members are connected by a connecting wire.

A bus bar electrode 14a is connected with one balanced input terminal via external wiring 34, and leading out electrodes 16a and 16b are connected with the other balanced input terminal via external wiring 35. A bus bar electrode 15b is connected with one balanced output terminal via external wiring 36, and leading out electrodes 17a and 17b are connected with the other balanced output terminal via external wiring 37.

In FIG. 3, the leading out electrodes 17a and 17b on the output side of the first stage SAW filter 32 are connected to the leading out electrodes 16a and 16b on the input side of the next stage SAW filter 33 with the connecting wires 39a and 39b, respectively. The bus bar electrode 15a of IDT electrode which is another output of the first stage output is connected by the connecting wire 40 to the IDT electrode 14a which is another output of the next stage.

In this manner, even between the filter stages, there can be realized reduction of increase in insertion loss at the time of the multi-stage operation and improvement to the balance level of balanced type input and output terminals, by connecting one part of the IDT electrodes at two places of 39a and 39b.

The wire connections of the multi-stage filter on the input side and output side as shown in FIG. 3 are similar to those of FIG. 1, and have the same action and effect.

Figure 4:
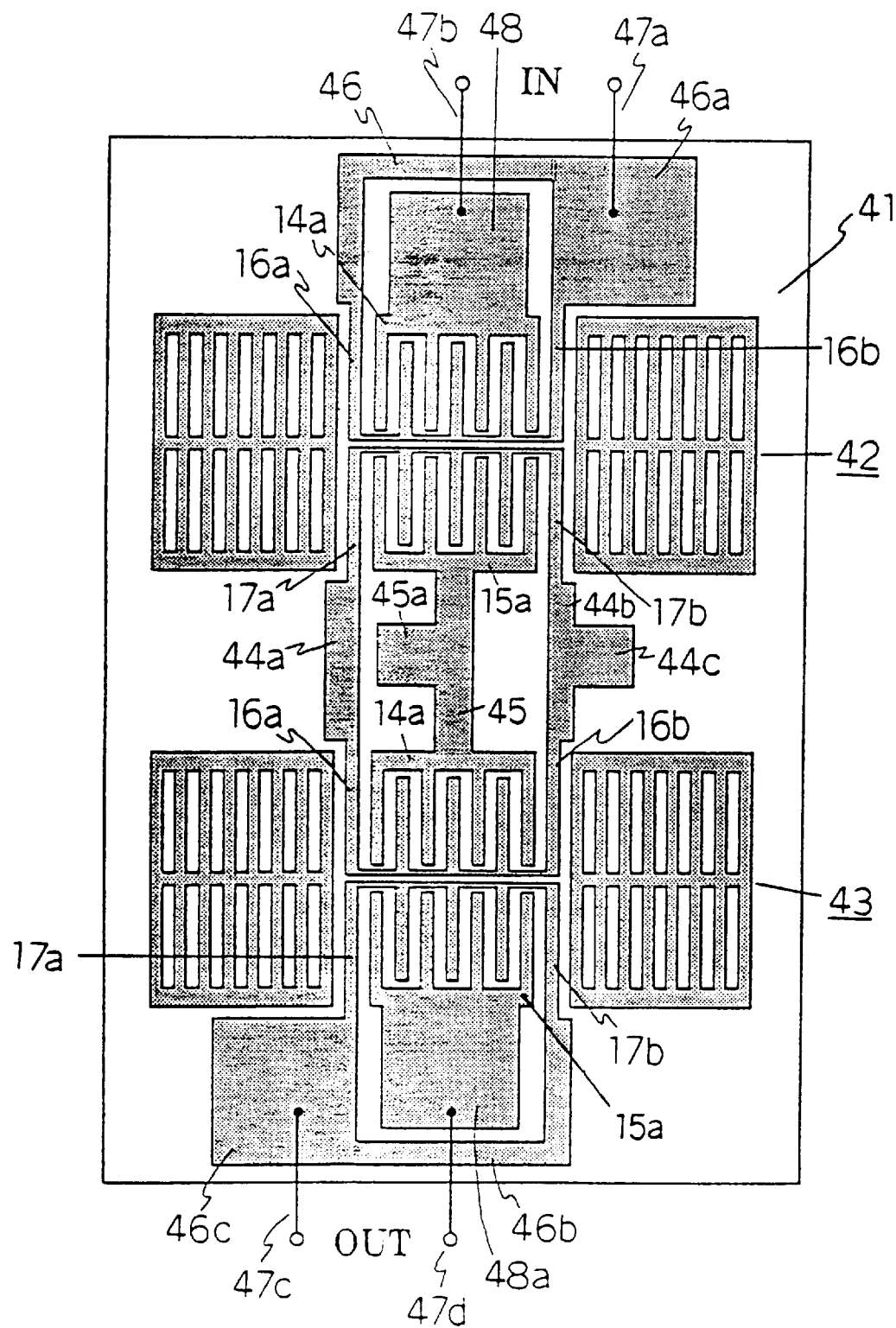
FIG. 4 is a constitution view showing another example of a multi-stage SAW filter according to the first embodiment of the present invention.

FIG. 4 shows an example where the inter-stage and input and output wirings are carried out by the wiring patterns formed on the substrate 41.

On the piezoelectric substrate 41, there are formed the first SAW filter 42 and the second SAW filter 43 which have the same constitutions as the SAW filters shown in FIG. 1, FIG. 2, and FIG. 3.

The leading out electrodes 17a and 17b on the output side of the first SAW filter 42 are connected to the leading out electrodes 16a and 16b on the input side of the second filter 43 by forming the first inter-stage connection electrodes 44a, 44b of wider width than the resonator electrodes on a piezoelectric substrate 41. Also, another output 15a of the first filter 42 and another input 14a of the second filter 43 are connected by forming the second inter-stage connecting electrode 45 having wider width than the electrode of the resonator on the piezoelectric substrate 41.

The leading out electrodes 16a and 16b on the input side of the first filter 42 are connected by the wiring pattern 46 having the wider width than the resonator electrode formed on the piezoelectric substrate 41. Further, a part of said wiring pattern 46 is further expanded to form one connecting land 46a with the outer wiring member 47a of the balanced type input terminal, and the bus bar electrode 14a of outside IDT electrode is expanded outward to form a connecting land 48 with the external wiring member 47b of the balanced type input terminal.

On the other hand, the area between the leading out electrodes 17a and 17b on the output side of the second filter is connected by the wiring pattern 46b of wider line width than the resonator electrode width formed on the piezoelectric substrate 41. Further, a part of the said wiring pattern is further extended to form a connection land 46c with the outside wiring member 47c of the balanced type output terminal, and the bus bar electrode 15a is extended outward to form a connection land 48a with the external wiring member 47d of the balanced type output terminal.

By such a pattern constitution, there can be provided a balanced type multi-stage SAW filter having low insertion loss and good balancing level.

The lands 44c, 45a for external wiring provided on the inter-stage connection electrodes 44b, 45 of FIG. 4 are useful in the connection of the external circuit element for filter characteristic adjustment.

By the way, there may be cases where the desired good transmission characteristics cannot be obtained because of the mismatching of the input and output impedance's in the stages.

In such a case, the reactance element such as an inductor may be connected as a matching element to the inter-stage connecting electrode to make adjustment. The lands 44c, 45a for external wiring are useful for the purpose. Alternatively, by adopting such a constitution that a reactance element such as a spiral inductance is formed on the same piezoelectric substrate 41 or on a separate substrate and connected to the inter-stage connecting electrode, no extra space is necessitated, and reduction of filter circuit size can be easily realized. The reactance element for adjustment may be connected to either one of the inter-stage connecting lands 44c, 45a and the other land may be grounded. According to the experiment, improvements of the symmetric property of the filter transmission characteristic is observed in the case that the reactance element is connected to the first connection land 44c.

(Embodiment 2)

Figure 5:
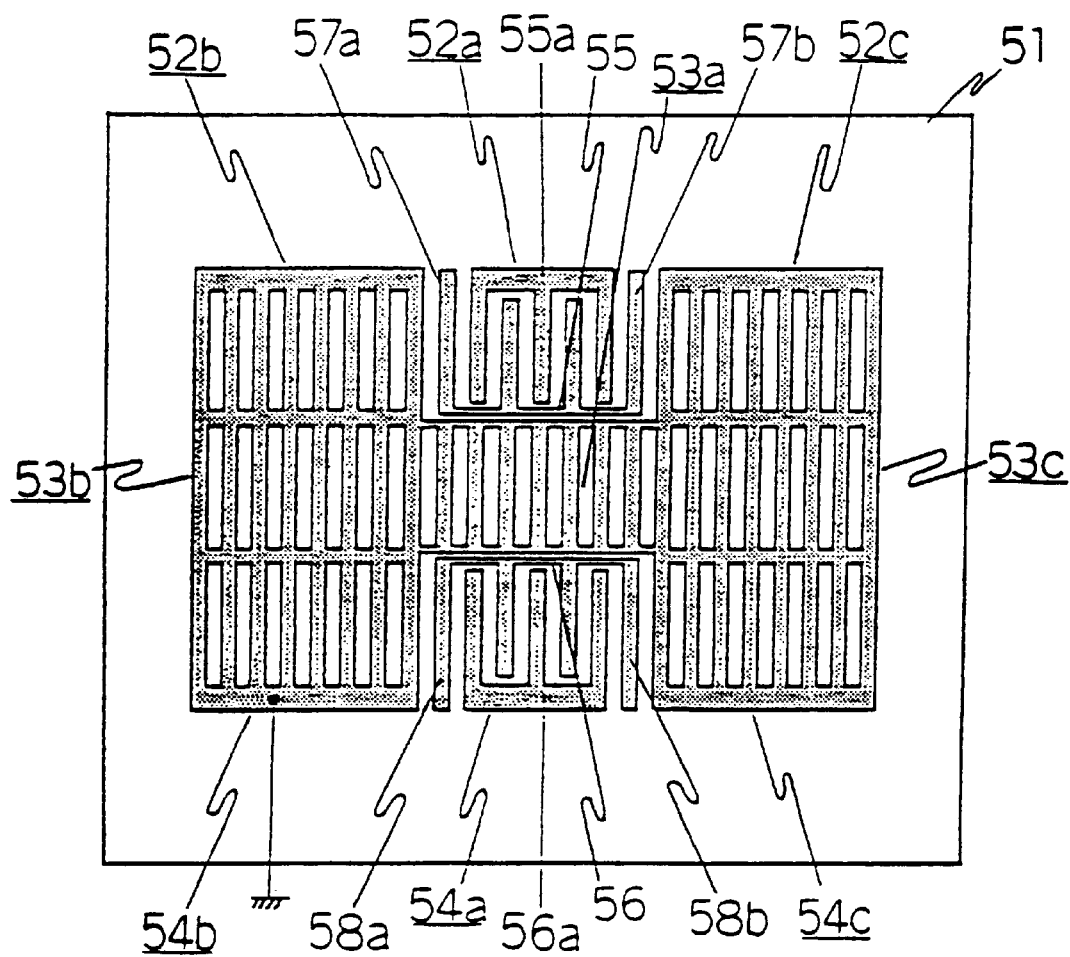
FIG. 5 is a constitution view showing a SAW filter according to the second embodiment of the present invention.

FIG. 5 is a constitution view showing a SAW filter according to the second embodiment of the present invention.

By forming an electrode pattern having a strip line shaped periodical structure on a piezoelectric substrate 51 shown in FIG. 5, SAW can be excited. On the piezoelectric substrate 51 there is formed a first SAW resonator of energy strage type constituted by an IDT electrode 52a and reflector electrodes 52b, 52c. Also, on the piezoelectric substrate 51, there is constituted a third SAW resonator constituted by an IDT electrode 54a and reflector electrodes 54b, 54c.

The point to be specially noted here is that the IDT electrode part of the second SAW resonator formed between the first SAW resonator and the third SAW resonator accompanied with the reflector electrodes 53b, 53c, has a similar structure to that of the reflector electrode, and is constituted by a periodic structure strip line electrode row 53a having approximately the same length as the crossing width of the electrode fingers of the IDT electrodes 51a, 54a in the first and third SAW resonators.

In other words, even if the structure of the electrode part of the second SAW resonator is not of the same structure as those of the above-described IDT electrodes 52a, 54a but is changed to the periodic structured strip line electrode row 53a, if the electrode period is the same, the SAW can be transmitted in entirely the same manner. Accordingly, the acoustic behaviors of the central part second SAW resonator make no difference from the case of the IDT electrode structure.

The above three SAW resonators have the acoustic couple closely disposed to one another. The bus bar electrodes of the parts adjacent to one another are electrically independent. From both ends of the bus bar electrode 55 adjacent to the second SAW of the IDT electrode in the first SAW resonator, there are formed outward the first and second electrode fingers 57a and 57b which constitute a part of the balanced type input terminal, in the space between the IDT electrode 52a and the reflector electrodes 52b, 52c. Also, from both ends of the bus bar electrode 56 adjacent to the second SAW of the IDT electrode in the third SAW resonator, there are formed outward the third and fourth electrode fingers 58a and 58b which constitute a part of the balanced type output terminal, in the space between the IDT electrode 54a and the reflector electrodes 54b, 54c. The electrode constitutions described above are the basic constitutions of the triple mode SAW filter having the balanced type input and output terminals of low insertion loss according to the present invention.

Figure 6:
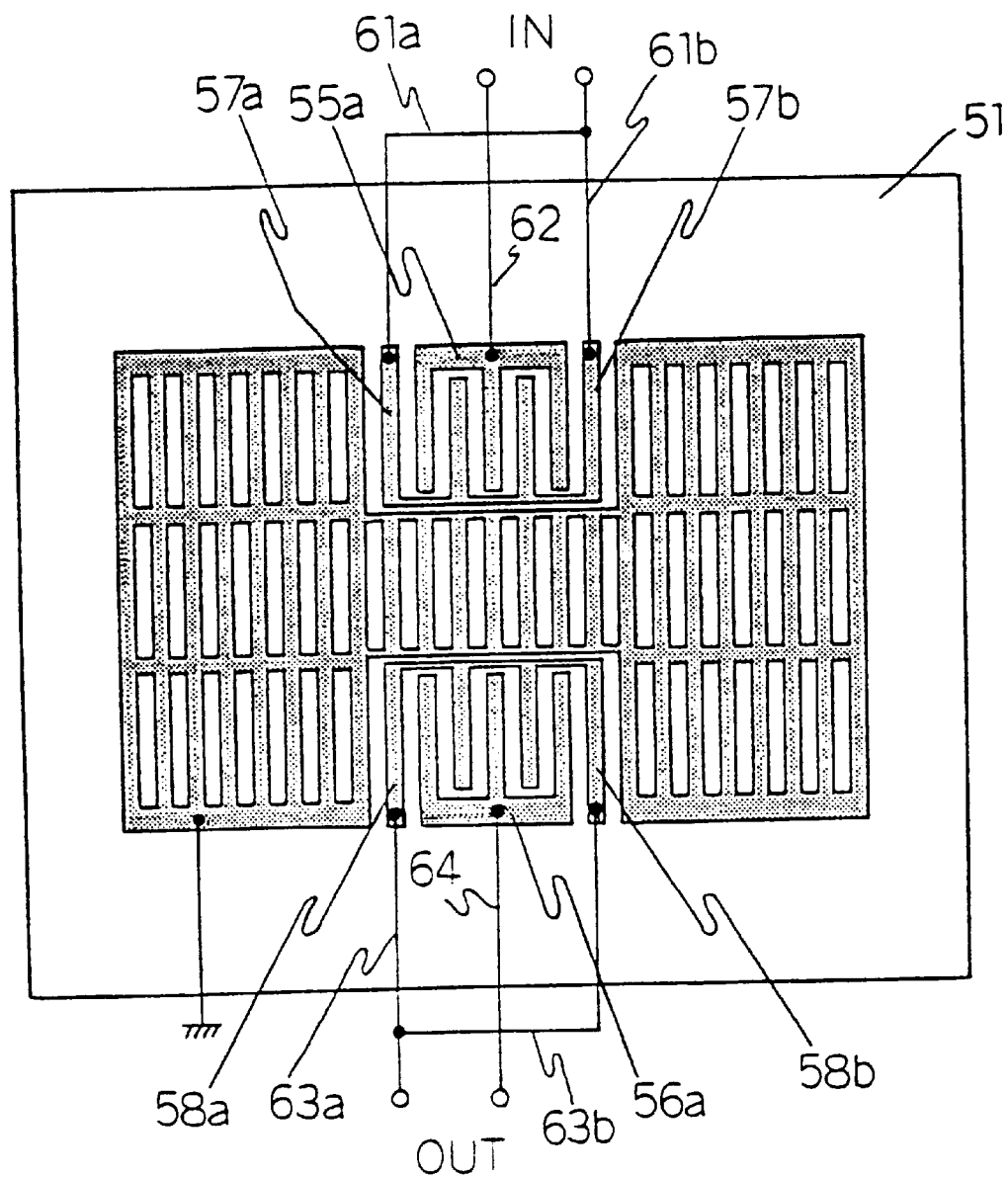
FIG. 6 is a constitution view showing another example of a SAW filter according to the second embodiment of the present invention.

FIG. 6 shows an example of connection of a balanced type input and output terminal of the present invention for the triple mode SAW filter as explained in FIG. 5.

As shown in said figure, the first electrode finger 57a and the second electrode finger 57b of the first SAW resonator are connected by the connecting wires 61a, 61b to make one input terminal of the balanced type input terminal, and the connecting wire 62 is led out from the bus bar electrode 55a of the outside IDT electrode to make the other input terminal of the balanced type input terminal. And, the third electrode finger 58a and the fourth electrode finger 58b of the third SAW resonator are connected by the connecting wires 63a, 63b to make one output terminal of the balanced type input terminal, and the connecting wire 64 is led out from the bus bar electrode 56a of the outside IDT electrode to make the other output terminal of the balanced type input terminal.

Figure 7:
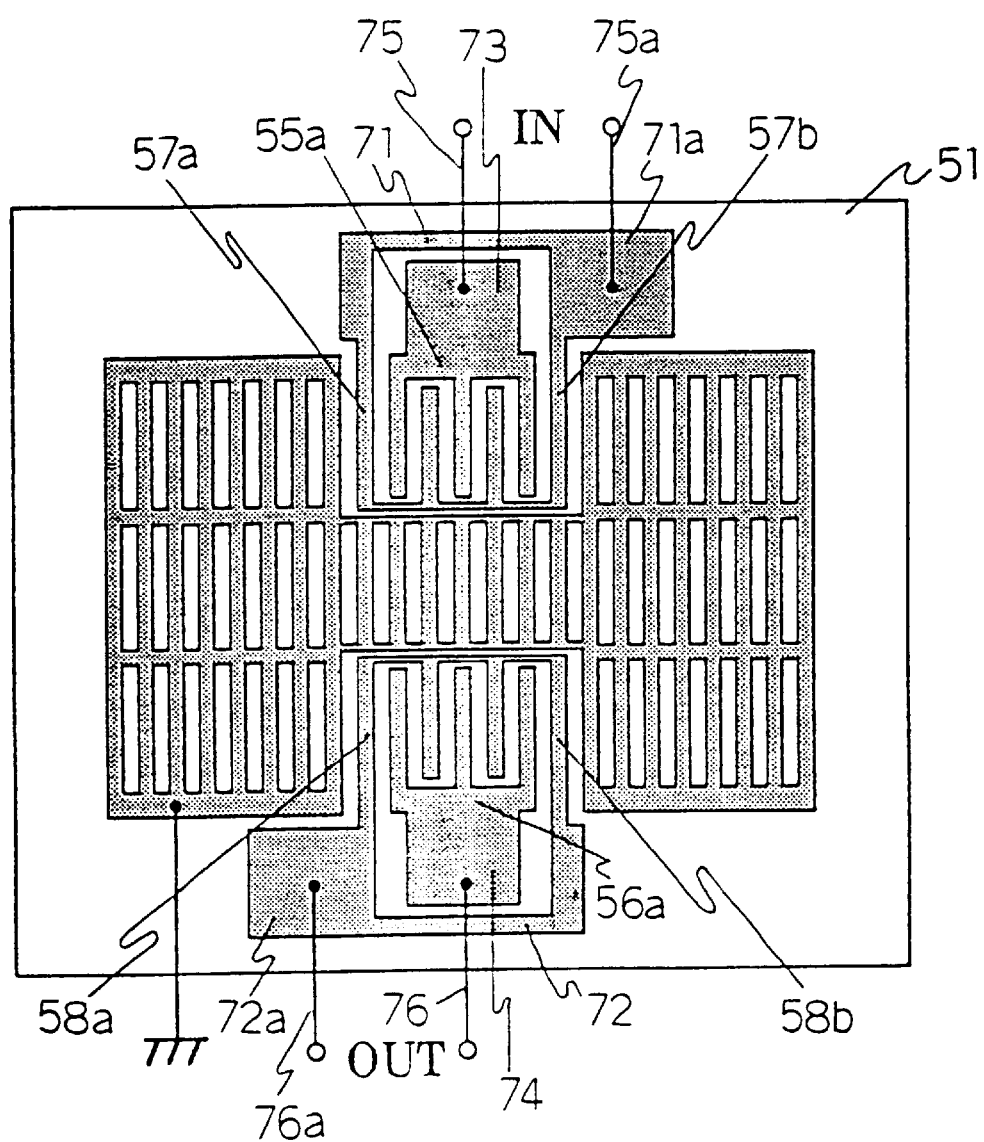
FIG. 7 is a constitution view showing another example of a SAW filter according to the second embodiment of the present invention.

FIG. 7 shows another embodiment of the constitution of the balanced type input and output terminal of the triple mode SAW filter.

As shown in said figure, the area between the first electrode finger 57a of the first SAW resonator and the second electrode finger 57b is connected by the wiring pattern 71 of wider line width than the resonator electrode width formed on the piezoelectric substrate 51. Further, the pattern 71 is further extended to form a connection land 71a with the external wiring member 75a, and the bus bar electrode 55a of IDT electrode is extended outward to form a connection land 73 with the external wiring member 75, and the area between the third and fourth electrode fingers 58a and 58b of the third SAW resonator is formed on a piezoelectric substrate 51 to make a resonator electrode, and connection is made by the wiring pattern 72 which has the wider line width than the resonator electrode. The pattern 72 is further extended to form a connection land 72a with the external wiring member 76a, and the bus bar electrode 56a of IDT electrode is extended outward to form a connection land 74 with the external wiring member 76. According to such a constitution, similarly to what SAW described in the first embodiment, it becomes possible to provide a triple mode SAW filter in which the insertion loss is further reduced and connection with the external circuit is easy, as explained in the first embodiment.

Figure 8:
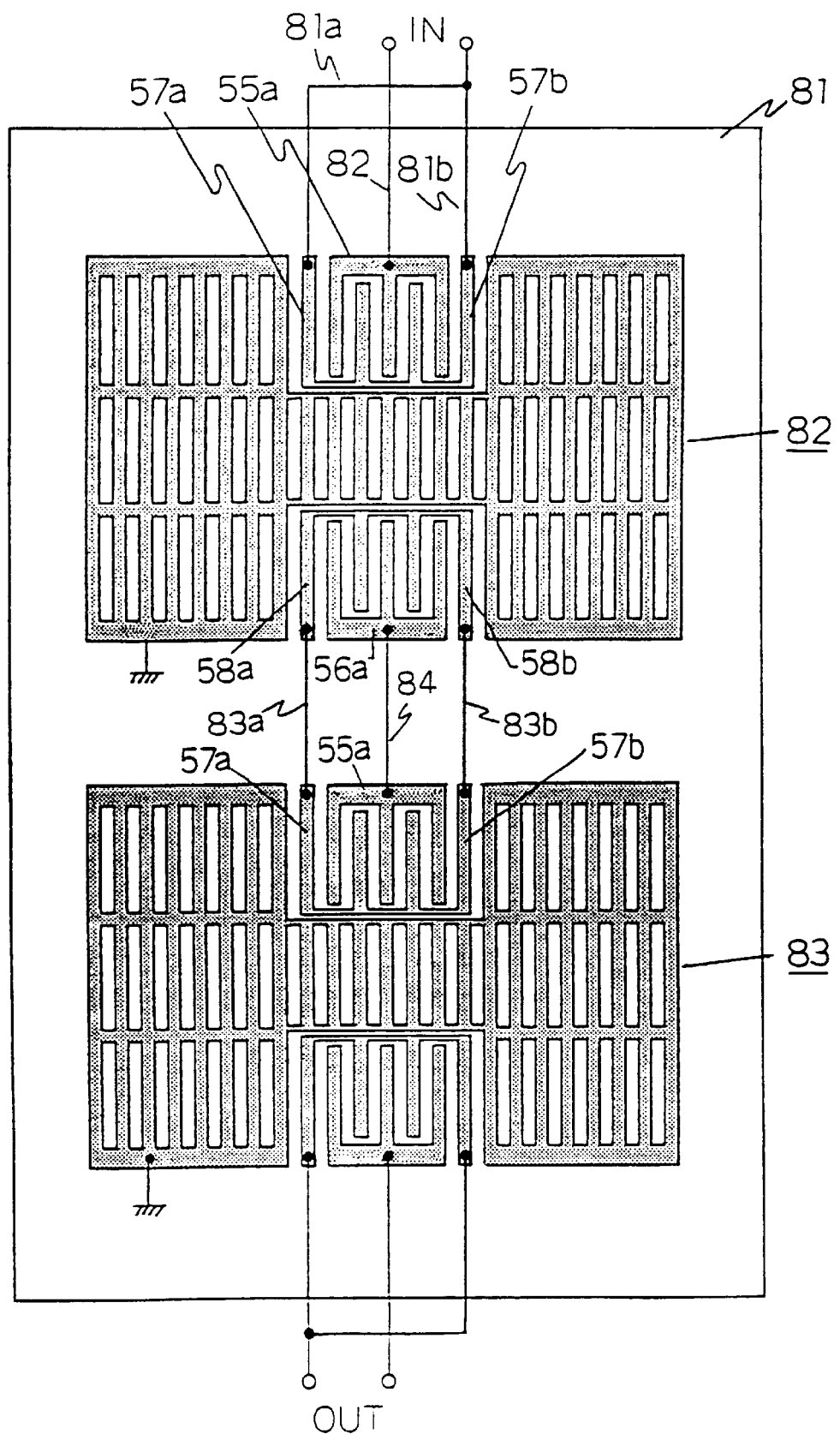
FIG. 8 is a constitution view showing a multi-stage SAW filter according to the second embodiment of the present invention.

FIG. 8 shows an example of the case where a plurality of the triple mode SAW filters as explained with reference to FIG. 5 are stepwise connected vertically.

As shown in the figure, on the piezoelectric substrate 81 there are formed a first triple mode SAW filter 82 and a second triple mode SAW filter 83. The third and fourth electrode fingers 58a, 58b on the output side of the first filter 82 and the bus bar electrode 56a on the output side are stepwise connected to the first and second electrode fingers 57a, 57b on the input side and the bus bar electrode 55a on the input side, of the second filter 83, by the connecting wires 83a, 83b, and 84. The parallel type wire connections of the input circuit and output circuit are entirely same as the wiring constitution of the single stage filter shown in FIG. 6.

Figure 9:
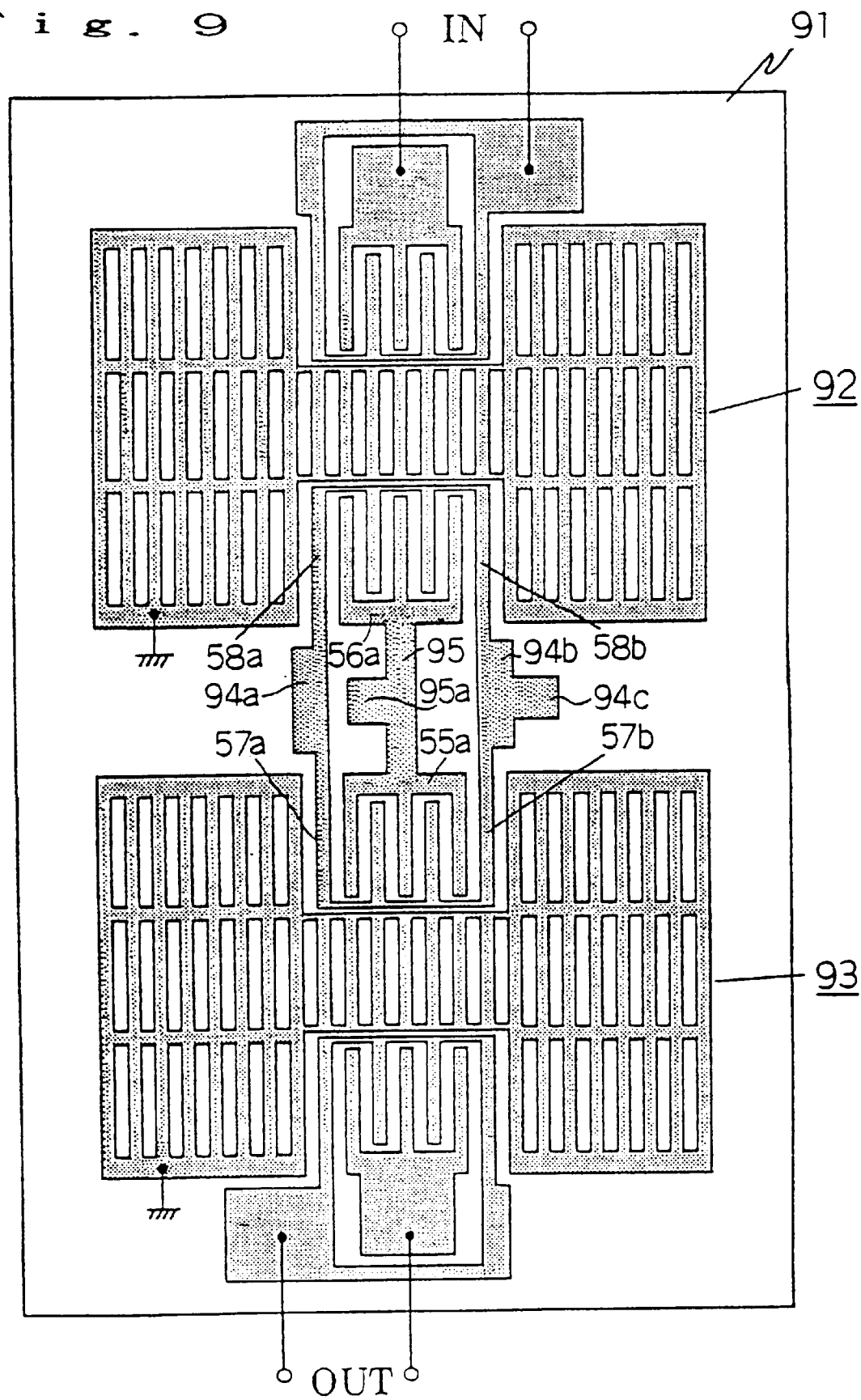
FIG. 9 is a constitution view showing another example of a multi-stage SAW filter according to the second embodiment of the present invention.

FIG. 9 shows another example of the input and output constitutions and the inter-stage constitutions of the vertical connection triple mode SAW filter as shown in FIG. 8.

As shown in said figure, on the piezoelectric substrate 91, there are formed a first triple mode SAW filter 92 and a second triple mode SAW filter 93. The two filters are Interstage connected by the inter-stage connecting electrodes 94a, 94b, and 95 having wider widths than the width of the resonator electrode which is formed by placing the third and fourth electrode fingers 58a, 58b on the output side, and the bus bar electrode 56a, of the first filter 92, and the first and second electrode fingers 57a, 57b on the input side, and the bus bar electrode 55a on the input side of the second filter 93, on the piezoelectric substrate 91. The lands 94c, 95a formed on a part of each connecting electrode are convenient to use for the connection of the external elements for adjusting filter characteristics. The wiring patterns of the input circuit and output circuit are entirely same as those of the single stage filter constitution shown in FIG. 7.

As described above, according to the embodiments 1 and 2, because the bus bar electrode of the IDT electrode is electrically independent, balanced input and output mode can be realized, and accordingly, the filter characteristics do not have the effects of floating capacity by the grounding condition of electrode, so that the characteristics in the rejection band and transition band are improved, and moreover, due to the leading out electrode structure which is characterized by the present invention, remarkable improvement of insertion loss and improvement in balance level in the balanced type input and output terminal can be realized.

In the embodiment 3, there is employed an example wherein, as a balanced type triple mode filter, there is used one in which the IDT electrode of the central part resonator as shown in FIG. 5 has a periodic structured electrode constitution same as the reflector electrode. Even when this part is an IDT electrode structure same as being heretofore used, the effect of improvement in the filter characteristic by the balanced wiring connection by the present invention is obtainable in exactly the same manner.

(Embodiment 3)

Figure 10:
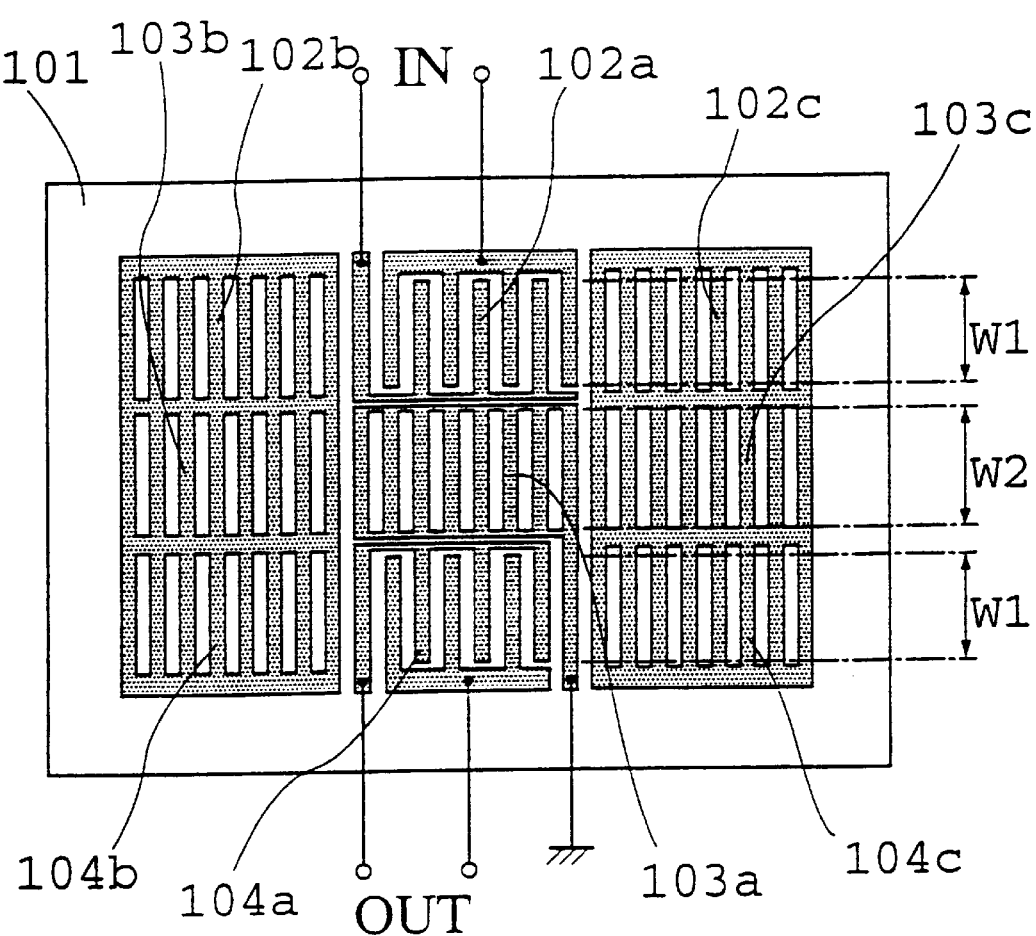
FIG. 10 is a constitution view showing a SAW filter according to the third embodiment of the present invention.

FIG. 10 is a constitution view showing the third embodiment of the SAW filter according to the present invention.

In FIG. 10, the part 101 is a single crystal piezoelectric substrate. By forming an electrode pattern on the piezoelectric substrate 101, SAW can be excited. On the piezoelectric substrate 101 there is formed an energy strage type first SAW resonator constituted by an IDT electrode 102a and reflector electrodes 102b, 102c. Also, on the piezoelectric substrate 101, there is formed a third SAW resonator constituted by an IDT electrode 104a and reflector electrodes 104b, 104c. The electrode part 103a of the second SAW resonator formed between the first SAW resonator and the third SAW resonator accompanied with the reflector electrodes 103b, 103c has the same structure as that of the reflector electrode.

As reviewed above, even if the structure of the electrode part 103a of the second SAW resonator is not of the same structure as those of the above-described IDT electrodes but is changed to the periodic structured strip line electrode row, if the electrode period is the same, the SAW can be transmitted in entirely the same manner. Accordingly, the acoustic behaviors of the second SAW resonator disposed at the central part make no difference from the case of the IDT electrode structure.

Furthermore, assuming that the electrode finger crossing width of IDT electrodes 102a, 104a in the first and third SAW resonators is W1, and the length of the strip line constituting the IDT electrode part 103a of the second SAW resonator is W2, setting is so made that the relative size between W1 and W2 becomes: $W1 \leq W2$.

The above three SAW resonators have the acoustic couple closely disposed to one another. The electrode finger of the IDT electrode 102a in the first SAW resonator is connected to the balanced type input terminal IN, and the electrode finger of the IDT electrode 104a in the third SAW resonator is connected to the balanced type output terminal OUT. The periodic structure strip line electrode row 103a in the second SAW resonator is grounded.

Hereinafter, the operation of the SAW filter constituted as above is explained.

Figure 11:
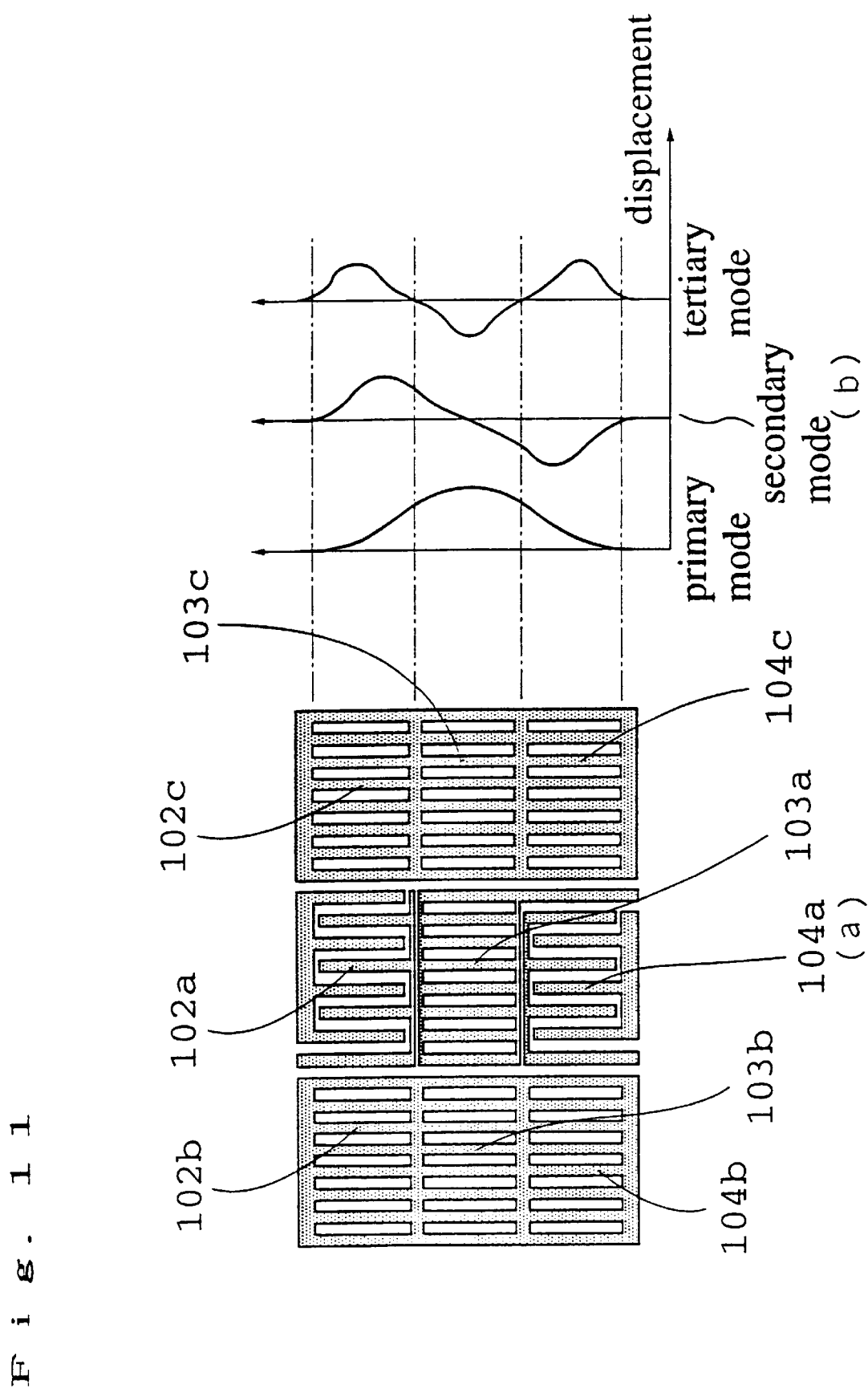
FIG. 11 is a distribution chart of an excitation mode for illustrating the operation of the SAW filter according to the third embodiment of the present invention.

FIG. 11 is an excitation mode distribution chart of the SAW filter in the present embodiment. To the parts corresponding to those of FIG. 10 the same marks are assigned. In FIG. 11, (a) is a constitution view of the electrode of the SAW filter shown in FIG. 10. Due to the closely related disposition of the first to third SAW resonators, acoustic couple is formed therebetween, and there are excited the primary, secondary, and tertiary modes having the potentials as shown in FIG. 11 (b). Here, due to all electrical grounding of the electrode part 103a of the third SAW resonator disposed at the center, the polarity of the secondary mode potential distribution is reversible at the center, so that there can be obtained strong excitation strength on the same level as that of the primary and tertiary modes. As this permits to constitute a multi-stage mode filter made by effective utilization of the three excitation modes, there can be realized a SAW filter having broad bandwidth with acute attenuation characteristics.

Figure 12:
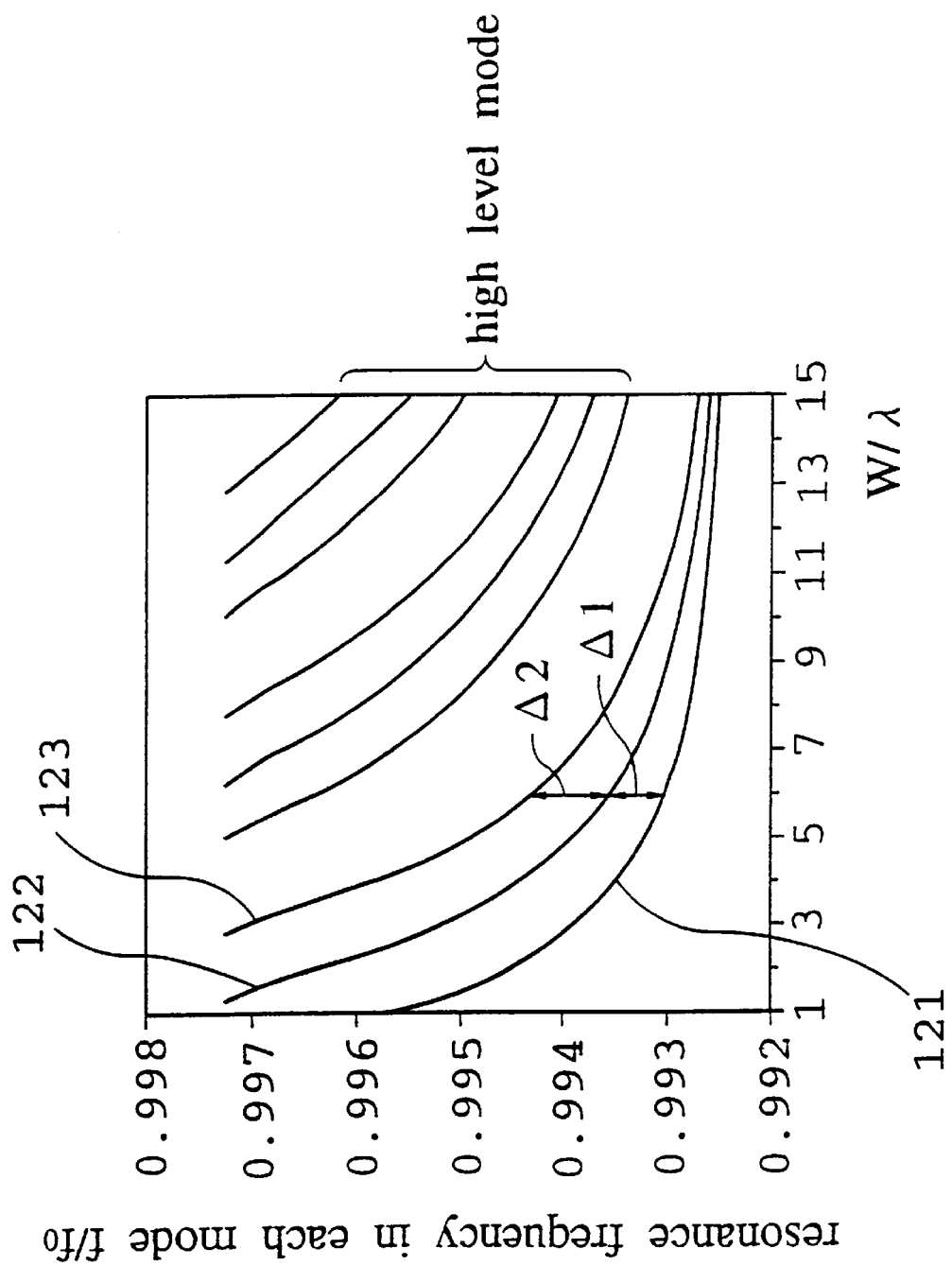
FIG. 12 is a characteristic chart of the resonance frequency of each mode to the value of W specified by the SAW wavelength λ in the case of W1=W2=W in the third embodiment of the present invention.
Figure 13:
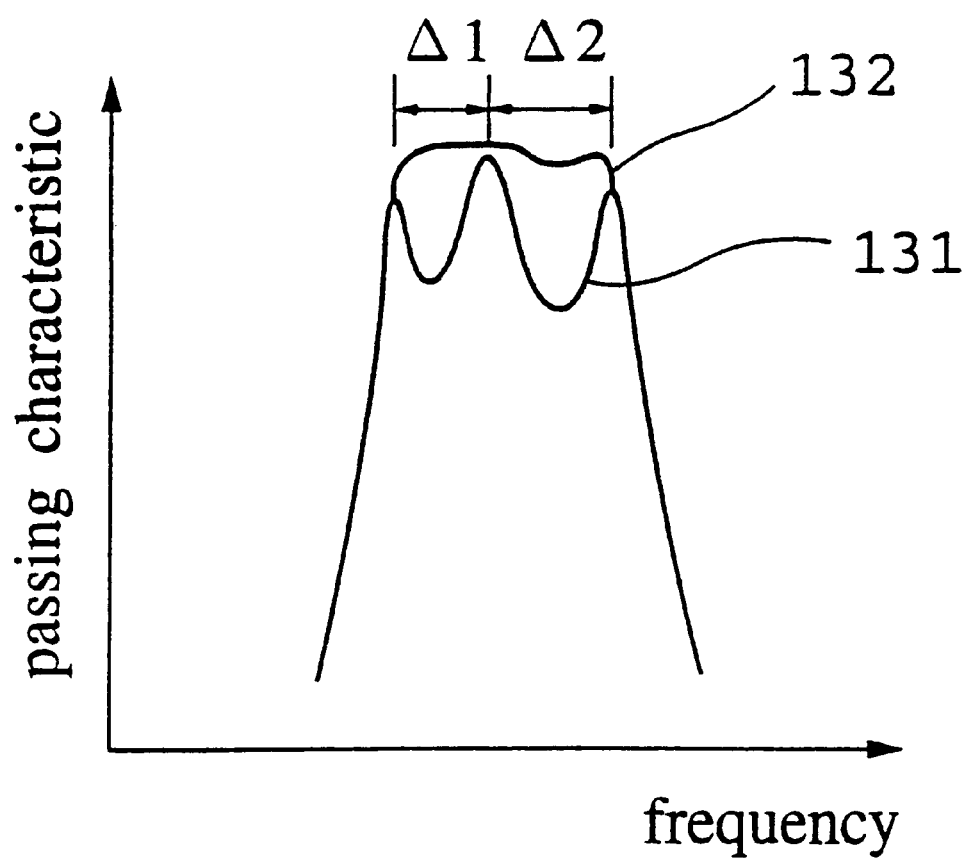
FIG. 13 is a representative actual measurement chart showing a comparative example of the passing characteristics of the SAW filter in the third embodiment of the present invention.

FIG. 12 shows a change of the resonant frequency of each mode to the value of W standardized by the SAW wavelength $\lambda$ in the case of W1=W2=W, obtained by the wave guide path mode analysis. The curves 121, 122, and 123 show the changes of the resonance frequencies in primary, secondary, and tertiary modes, respectively. As shown in FIG. 12, to a certain given value W, the frequency difference $\Delta 1$ between the primary mode and the secondary mode and the frequency difference $\Delta 2$ between the secondary mode and the tertiary mode become the difference values. Namely, when viewed with 50 $\Omega$ system, as shown in FIG. 13, the pass characteristic of the SAW filter does not show equal distance between the peaks of the three resonance modes as in the curve 131. Accordingly, even when the input and output are matched, ripples remain in the band as in the curve 132, and the filter characteristic is degraded.

Figure 14:
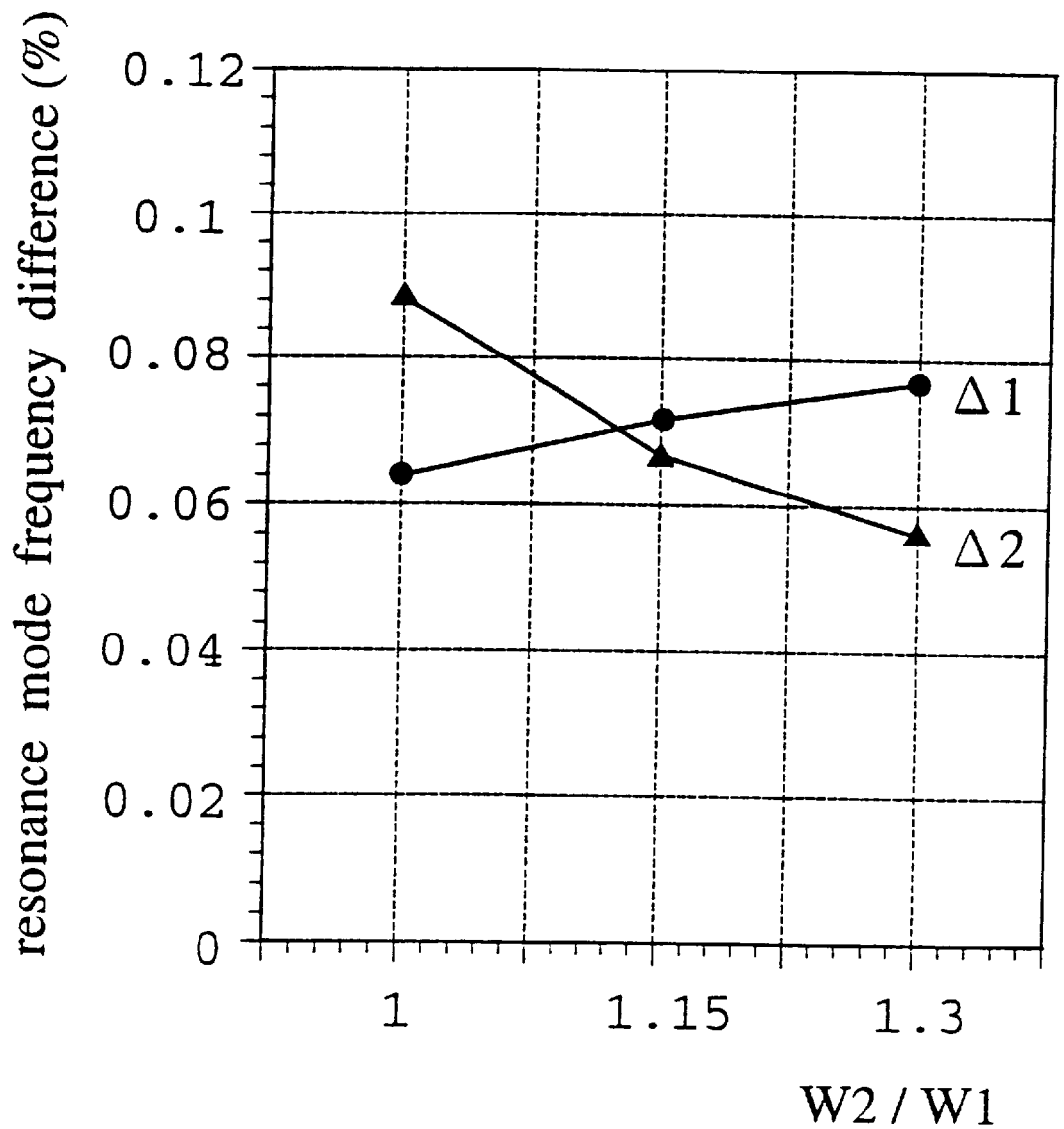
FIG. 14 is an actual measurement view of a resonance mode frequency difference to W2/W1 in the third embodiment of the present invention.

Here, an effect of the case where the ratio of the length of the strip line W2 constituting the electrode part 103a of the second SAW resonator to the electrode finger cross difference width W1 of IDT electrodes 102a, 104a in the first and third SAW resonator (W2/W1) is shown in FIG. 14. In FIG. 14, there is shown a standardized value of the actually measured amount of the frequency difference ($\Delta 1$, $\Delta 2$ in FIG. 13) in resonance mode to W2/W1 in the SAW filter of the present invention having the constitution of FIG. 10. FIG. 14 shows the values where the length W2 of the strip line constituting the electrode part 103a of the second SAW resonator is varied in the case where the IDT electrode finger crossing difference width W1 of the first and third SAW resonators is 6.5 wavelength, and the combined gap length G is 1 wavelength. As shown in FIG. 14, when the value of W2/W1 is about 1.13, the relation becomes: $\Delta 1 = \Delta 2$, i.e., the distance between the three resonance frequencies becomes equal. As to the allowance range, the relative sizes of W1 and W2 may be set so that they come into the range of $1 \leq W2/W1 \leq 1.3$. Practically, considering the scattering in manufacture, the values of W1 and W2 may be set in the range of $1 \leq W2/W1 \leq 1.16$.

Figure 15:
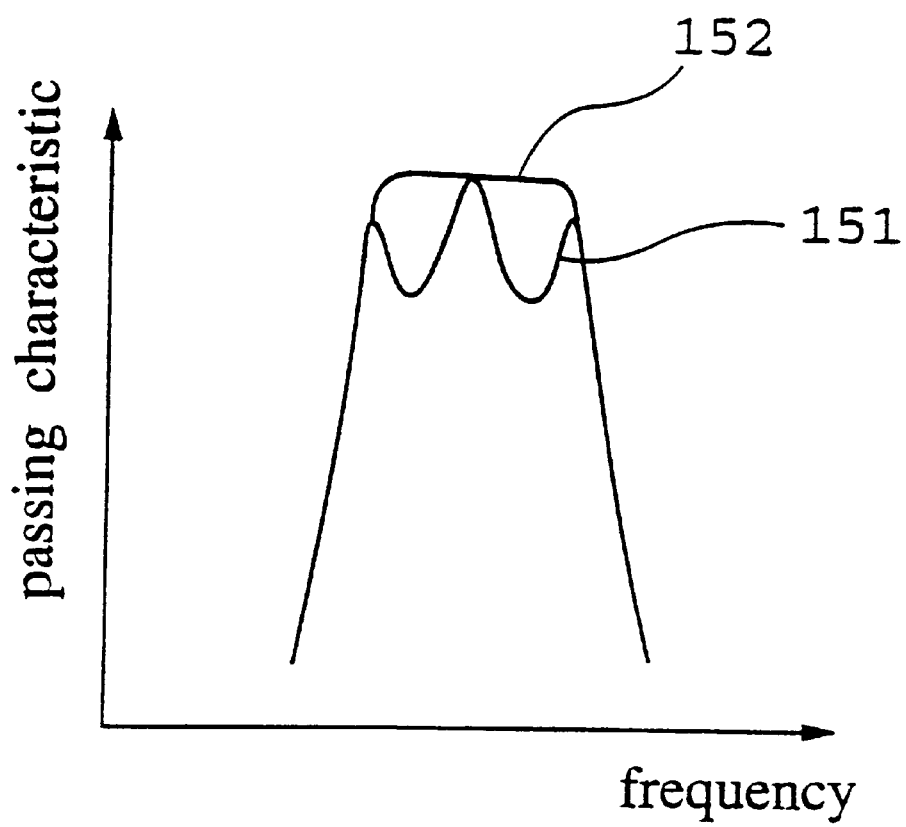
FIG. 15 is an actual measurement view showing the pass characteristic of SAW filter in the third embodiment of the present invention.

FIG. 15 shows the passing characteristic of the SAW filter in he case of W1=6.5 wavelengths, W2=7.5 wavelengths, i.e., W2/W1=1.15. In FIG. 15, the numeral 151 shows the characteristic of the case observed in 50 $\Omega$ system, and 152 shows the characteristic of the case of matching taken. It can be seen that, in comparison with the case of FIG. 13, the ripples in the pass band apparently decrease to give excellent passing characteristic.

As described above, according to the embodiment 3 of the present invention, three SAW resonators are disposed in adjacent relations with one another, and the electrode part of the central SAW resonator is constituted by a strip line having slightly longer periodic structure than the cross difference width of the IDT electrode fingers of the first and third SAW resonators, and all of them are grounded. By such constitution, there can be obtained a SAW filter having wide bandwidth and flat pass characteristic and acute attenuation characteristic.

Furthermore, due to the electrical isolation of the bus bar at the central part of the IDT electrode, it becomes possible to wire the IDT electrode 102a of the first SAW resonator and the SAW resonator 104a of the third SAW resonator all independently, so that the balanced input and output of the SAW filter can be made. Consequently, the filter characteristic becomes free from the effect of the floating capacity or the like depending on the grounding condition of the electrode, and the characteristics of the rejection band and transition band are further improved. In addition, it becomes possible to connect the balanced type elements such as IC to the front and rear stages of the filter without using any external extra circuit such as Balun, thus improving the noise characteristics of the whole circuit.

In FIG. 10, the electrode part 103a of the second SAW resonator is grounded through the electrode pattern existing in the space between the IDT electrode 104a of the third SAW resonator and the reflector electrode 104c, but the constitution is not limited to it; and the grounding may be made through the reflector electrodes 103b, 103c on both sides of the electrode part 103a.

Figure 16:
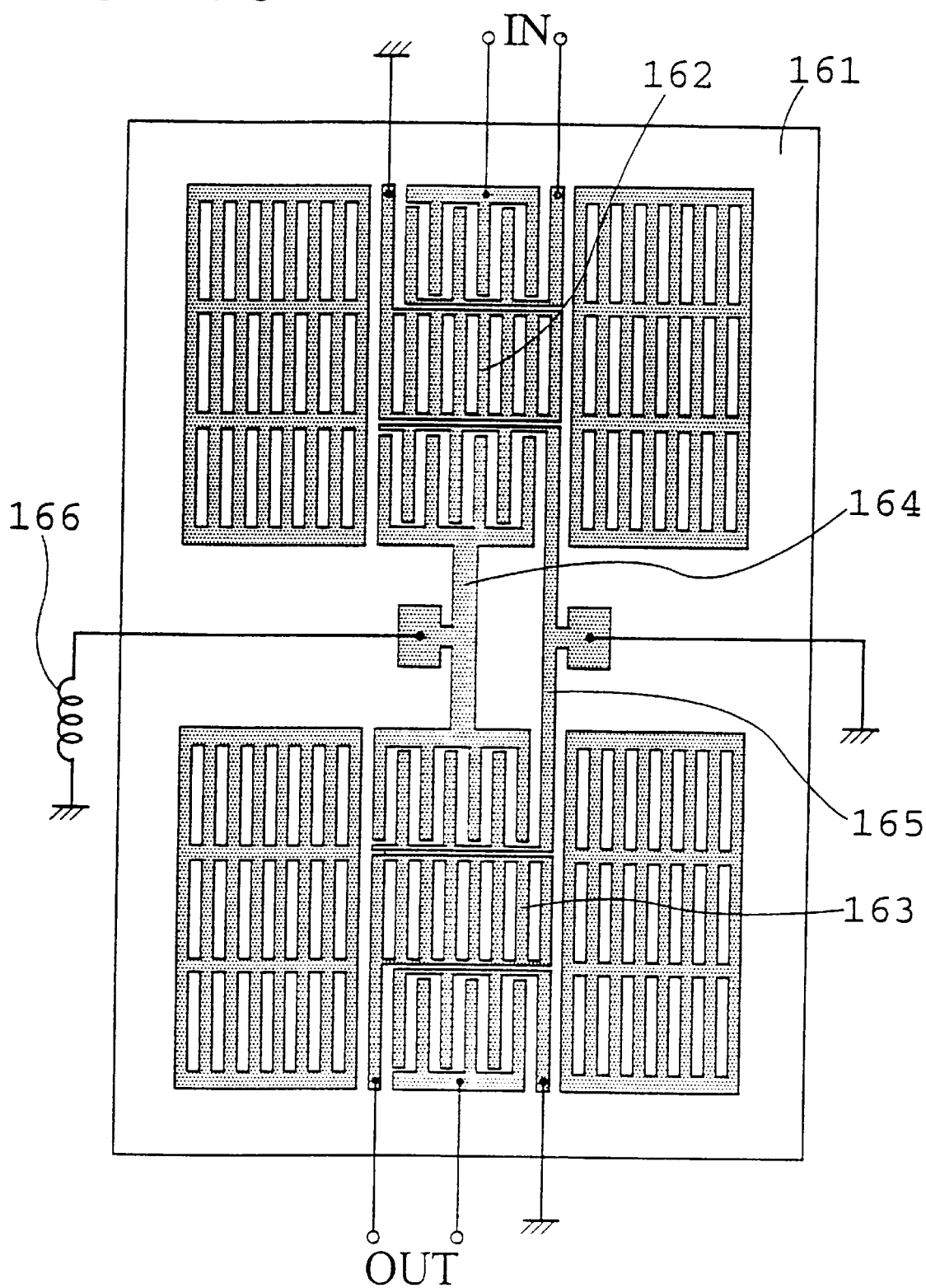
FIG. 16 is a constitution view showing another example of the SAW filter in the third embodiment of the present invention.

In this embodiment 3, explanation is given by taking an example of a SAW filter of single stage constitution. However, as shown in FIG. 16, when a multi-stage connection type SAW filter is constituted by vertically connecting a plurality of SAW filters 162, 163 on the same piezoelectric substrate 161, though the insertion loss increases to some extent, the characteristics of the rejection band and transition band are remarkably improved to give more excellent filter characteristics. In this case, it is preferable for the first SAW resonator electrode of the front stage SAW filter to be connected to the balanced type input terminal, and the third SAW resonator electrode of the rear stage SAW resonator to be connected to the balanced type output terminal. This is because the filter can be easily connected to the peripheral circuit such as a balanced type front end IC, making it unnecessary to secure ground for wiring, so that the stabilized filter characteristics are obtainable with less effect of floating capacity.

By the way, a simple vertical connection of the SAW filters may not give good transmission characteristic due to the mismatching of the input and output impedances in each stage. In such a case, the reactance elements such as inductance may be connected as matching elements to the inter-stage connecting electrode patterns 164, 165. In this case, in order to make full coordination with the balanced type input and output circuit, a matching element is required to be connected between the electrode patterns 164 and 165. However, in practice, the inter-stage portions have no electrical connection with the input and output terminals but have acoustic couple only. Accordingly, if one electrode pattern (e.g., electrode pattern 165) is directly grounded, and the other electrode pattern (e.g., electrode pattern 164) is grounded through the reactance element, the operation similar to the case of a reactance element having been connected between the two can be realized. And, when such a constitution is adopted, the wiring for grounding can be made on an electrode pattern, and therefore the use of bonding wires can be reduced.

(Embodiment 4)

Figure 17:
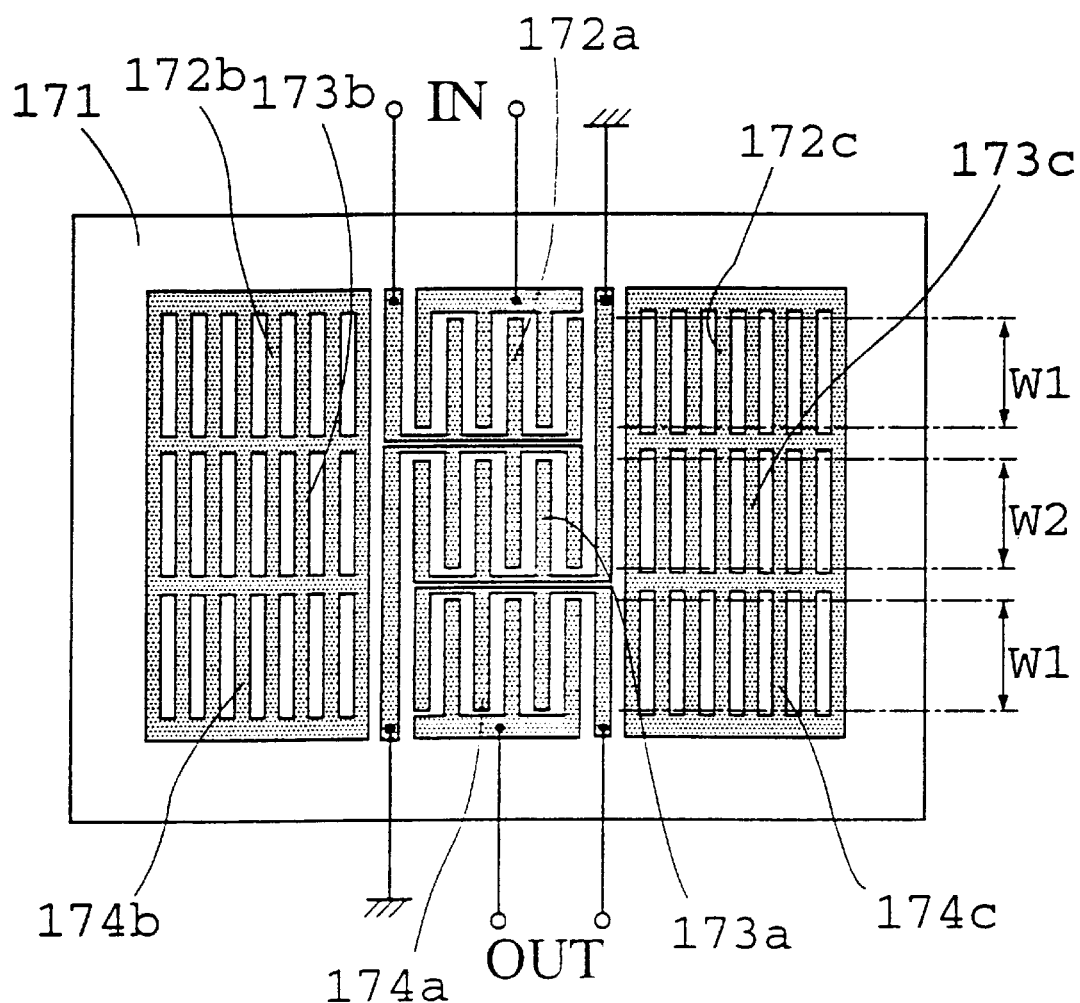
FIG. 17 is a constitution view showing a SAW filter in the fourth embodiment of the present invention.

FIG. 17 is a constitution view showing the fourth embodiment of the SAW filter according to the present invention.

In FIG. 17, the part 171 shows a single crystal piezoelectric substrate. By forming an electrode pattern on the piezoelectric substrate 171, a SAW can be excited in the same manner as in the third embodiment. On the piezoelectric substrate 171, there is formed a first SAW resonator of energy strage type constituted by an IDT electrode 172a and reflector electrodes 172b, 172c. Also, on the piezoelectric substrate 171, there are formed a second SAW resonator of energy strage type constituted by an IDT electrode 173a and reflector electrodes 173b, 173c and a third SAW resonator of energy strage type constituted by an IDT electrode 174a and reflector electrodes 174b, 174c. And, these three SAW resonators are disposed in close relations to one another, and the bus bar electrodes of mutually adjacent IDT electrodes are electrically independent. Also, the reflector electrodes are connected by the common bus bar. The electrode finger of the IDT electrode 172a in the first SAW resonator is connected to the balanced type input terminal IN, and the electrode finger of the IDT electrode 174a in the third SAW resonator is connected to the balanced type output terminal OUT. The electrode fingers of the IDT electrode 173a in the second SAW resonator are all grounded. Furthermore, when the electrode finger crossing difference width of the IDT electrodes 172a and 174a in the first and third SAW resonator is assumed to be W1, and the electrode finger crossing difference width of the IDT electrode 173a in the second SAW resonator is assumed to be W2, setting is so made that the relative sizes of W1 and W2 become: $W1 \leq W2$.

With respect to the SAW filter having the above constitution, the electrode structure of the second SAW resonator at the central part is changed from the periodic structure strip line electrode rows in the above third embodiment to the IDT electrode 173a, but as the transmission of the SAW is carried out in exactly the same manner, the basic operation is same as the case of the third embodiment shown in FIG. 10. Accordingly, flattening of passing characteristic of SAW filter and inhibition of spurious in the rejection band are realized in the same manner as in the third embodiment.

According to this embodiment 4, three SAW resonators are disposed in adjacent relations with one another, and all the IDT electrodes 173a constituting the central second SAW resonator are grounded, and their crossing widths are made slightly longer than the crossing width of the IDT electrode fingers of the first and the third SAW resonators, by which there can be obtained a SAW filter having wide bandwidth and flat pass characteristic and acute attenuation characteristic. Furthermore, due to the electrical isolation of the bus bar at the central part of the IDT electrode, it becomes possible to wire the IDT electrode 172a of the first SAW resonator and the SAW resonator 174a of the second SAW resonator all independently, so that the balanced input and output of the SAW filter can be realized. Consequently, the filter characteristic becomes free from the effect of the floating capacity or the like depending on the grounding condition of the electrode, and the characteristics of the rejection band and transition band are improved. In addition, it becomes possible to connect the balanced type elements such as IC to the front and rear stages of the filter without using any external extra circuit such as Balun, thus improving the noise characteristics of the whole circuit.

Furthermore, in this embodiment 4, when a plurality of SAW filters are vertically connected to constitute a multi-stage connection SAW filter, the characteristics of the transition band and the rejection band are remarkably improved. The method of vertical connection and method of connecting the reactance element (matching element) to the inter-stage part are exactly the same as those of the third embodiment shown in FIG. 16, and the effect on the filter characteristic is same as that described in the third embodiment.

In the above third embodiment, as shown in FIG. 10, the IDT electrode 102a of the first SAW resonator and the IDT electrode 104a of the second SAW resonator are disposed to be in reverse phase to each other. However, the invention is not necessarily limited to this constitution but the electrode dispositions may be of the same phase. Even in this case, except the slight difference in the mode of presence of extra-band spurious, the action and effect make no difference. In this respect, the same thing applies to the fourth embodiment.

In the above third and fourth embodiments, the input and output terminals are of balanced type, but they are not necessarily limited to the said constitution but it is possible to ground the unilateral sides of the input and output terminals respectively to adopt an unbalanced type. Moreover, in case of the grounding of either one side, a SAW filter having balanced-unbalanced terminals can be constituted.

(Embodiment 5)

Figure 18:
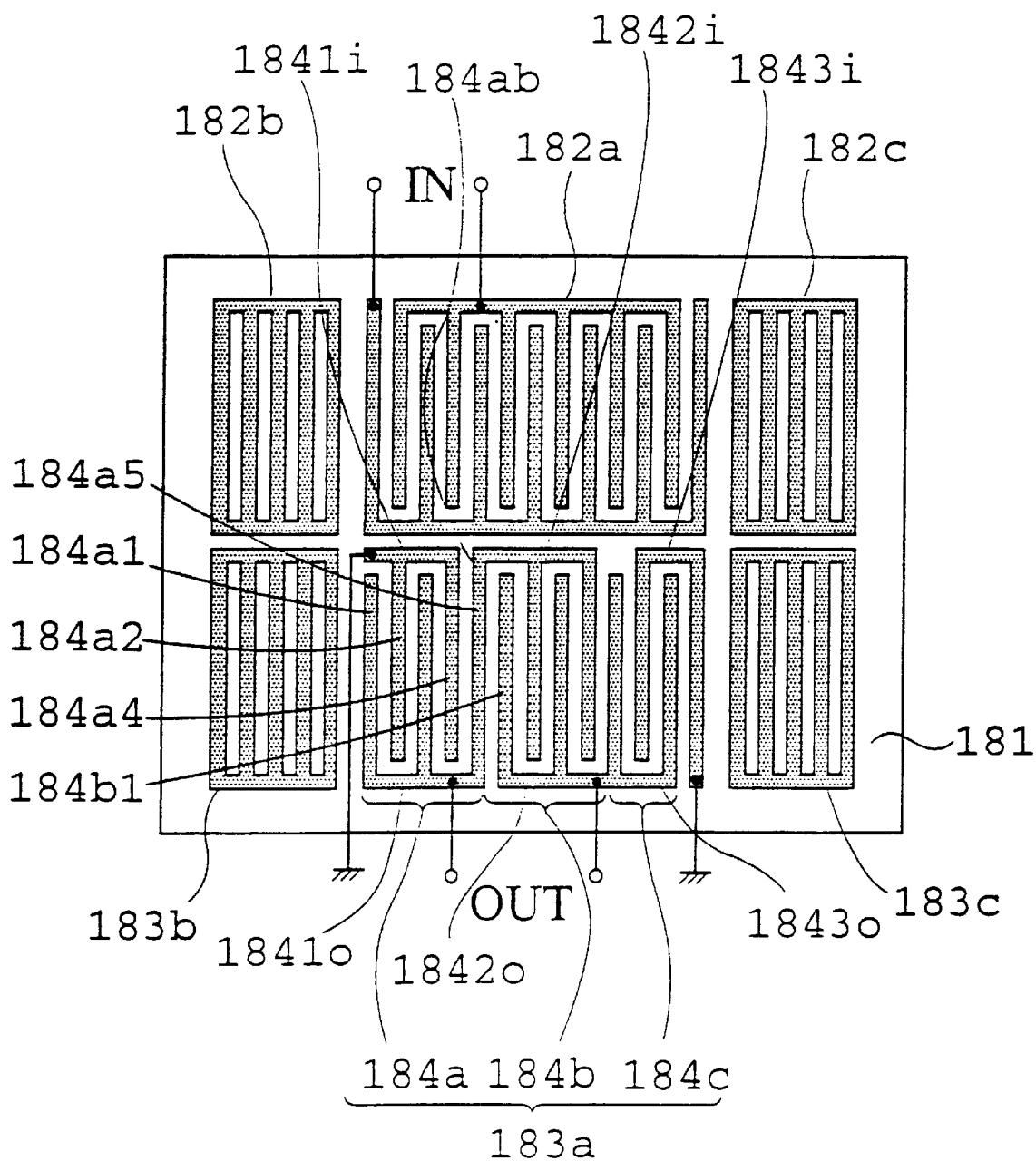
FIG. 18 is a constitution view showing a SAW filter in the fifth embodiment of the present invention.

FIG. 18 shows a constitution view of an electrode pattern according to Embodiment 5 of the SAW filter of the present invention.

In FIG. 18, the part 181 is a single crystal piezoelectric substrate. By forming an electrode pattern of periodic structure on the piezoelectric substrate 181, a SAW can be excited. On the piezoelectric substrate 181, there is formed a first SAW resonator of energy stage type constituted by an IDT electrode 182a and reflector electrodes 182b, 182c. Also, on the piezoelectric substrate 181, there is formed a second SAW resonator of energy stage type constituted by an IDT electrode 183a and reflector electrodes 183b, 183c.

As shown in FIG. 18, the IDT electrode 183a which constitutes the second SAW resonator is constituted by the connection of the three groups of the first, second, and third divisional IDT electrodes 184a, 184b and 184c. Here, the first divisional IDT electrode 184a and the second divisional IDT electrode 184b are disposed in reverse phases, and the second divisional IDT electrode 184b and the third divisional IDT electrode 184c are disposed in the same phase. With respect to the same phase and reverse phase, description will be given later.

The connection methods for these three groups are as noted below.

The lower electrode (outside bus bar electrode) 1841o of the first divisional IDT electrode 184a and the upper electrode (inside bus bar electrode) 1842i of the second divisional IDT electrode 184b are mutually connected through the fifth electrode finger 184a5 included in the first divisional IDT electrode 184a and a short connecting electrode 184ab. Also, the lower electrode (outside bus bar electrode) 1842o of the second divisional IDT electrode 184b and the lower electrode (outside bus bar electrode) 1843o of the third divisional IDT electrode 84c are connected.

By the above, an IDT electrode 183a which constitutes the second SAW resonator is formed.

The above grouping method is based on the divisional condition of the inside bus bar electrode and the divisional condition of the outside bus bar electrode.

Namely, due to the division of the upper electrode 1843i and the upper electrode 1842i, division is made to the third divisional IDT electrode 184c and the second divisional IDT electrode 184b. Also, due to the division of the lower electrode 1842o and the lower electrode 1841o, division is made to the second divisional IDT electrode 184b and the first divisional IDT electrode 184a.

And, these two first and second SAW resonators are disposed in adjacent relations with each other, and by the formation of acoustic couple between them an SAW filter is constituted.

Furthermore, the upper electrode and lower electrode of the IDT electrode 182a are connected respectively to the balanced type input terminal IN. The lower electrode of the first divisional IDT electrode 184a and the upper electrode of the second divisional IDT electrode 184b which constitute the IDT electrode 183a are connected to one of the balanced type output terminal OUT, and the lower electrode of the second divisional IDT electrode 184b and the lower electrode of the third divisional IDT electrode 184c are connected to the other of the balanced type output terminal OUT, and the upper electrode of the first divisional IDT electrode 184a and the upper electrode of the third divisional IDT electrode 184c are grounded, by which a balanced type input and output terminal is formed.

Here, explanation is given on the same phase and reverse phase as described above.

First, structural disposition relations of adjacent two electrode fingers (a pair of adjacent electrode fingers )are described.

That the adjacent two electrode fingers are in the same phase relations means that they are in such connection relations that one of the said two electrode fingers is connected to the inside bus bar electrode and extends outward from inside, and the other is connected to the outside bus bar electrode and extends inward from outside. Also, the adjacent two electrode fingers are in reverse phase relations means such connection relations that both of said two electrode fingers are connected to the inside bus bar electrodes and extend outward from inside, or that they are connected to the outside bus bar electrode and extend inward from outside. Here, it is assumed that the electric charges of the inside and outside bus bar electrodes are different, and that the pitch (distance between centers) between said adjacent two electrode fingers is ½×λ (wherein λ is wavelength of excited surface acoustic wave). The pitch between the electrode fingers may be (m+½)×λ(m=0,1,2,3 . . . ). If, in such case, the pitch is (m+1)×λ, then the contents of meaning fully reverse with respect to the above same phase relation and reverse phase relation.

Concretely, when observed with the first divisional IDT electrode 184a, as shown in FIG. 18, for example, the first electrode finger 184a1 and the second electrode finger 184a2 are in the same phase relation, and the fourth electrode finger 184a4 and the fifth electrode finger 184a5 are also in the same phase relation, and accordingly, all electrode fingers included in the first divisional IDT electrode 184a are in the same phase relations. Similarly, all electrode fingers included in the second and third divisional IDT electrodes 184b, 184c are in the same phase relations.

Next, with respect to the pair of electrode fingers 184a5 and 184b1, because the electrode finger 184a5 is connected to the outside bus bar electrode 1841o and the electrode finger 184b1 to the outside bus bar electrode 1842o, they are in the reverse phase relations. These adjacent two electrodes are disposed at the separating point between the first divisional IDT electrode 184a and the second IDT electrode 184b.

Accordingly, needless to say, the reverse phase or same phase referred to in respect to the above disposition of the three groups is based on the relations of the adjacent two electrode fingers as described above. This point is the same in other embodiments.

In addition, the width in the short length direction of the fifth electrode finger 184a5 will be related to below.

In FIG. 18, the constitution in which the width of the fifth electrode finger 184a5 is the same as that of other electrode finger is shown. However, without being limited to it, the width may of course be wider than that of other electrode finger. By so providing, the resistance value of the electrode finger is lowered, and accordingly the resistance value of the IDT electrode containing it becomes small to give an effect of decrease in insertion loss. This applies to the case of other embodiments.

With respect to the SAW filter in the fifth embodiment constituted as above, the operation is explained below.

Figure 19:
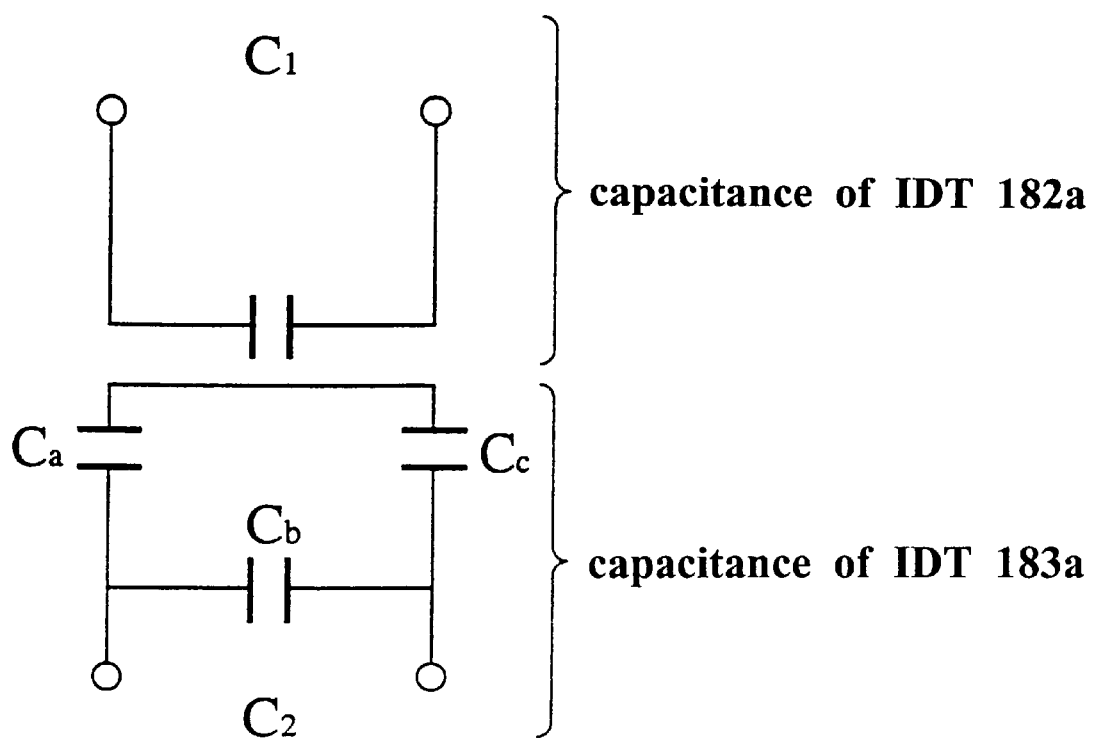
FIG. 19 is a capacity (capacitance) equivalent circuit diagram of the SAW filter in the fifth embodiment of the present invention.

FIG. 19 is a capacity (capacitance) equivalent circuit diagram according to the fifth embodiment, wherein $C_1$ is a capacity of the IDT electrode 182a which constitutes the first SAW resonator. Ca, Cb and Cc are the capacities of the first, second, and third divisional IDT electrodes 184a, 184b, and 184c, and the synthesized capacity of Ca, Cb and Cc becomes the total capacity $C_2$ of the second SAW resonator IDT electrode 183a. Here, assuming the number of couples of the electrode fingers included in the IDT electrode 183a to be n, and the respective number of couples of the third divisional IDT electrodes 184a, 184b, and 184c to be na, nab, and nc, the relation can be expressed by the following equation:

$$n = na + nb + nc$$

In the SAW filter as described above, the capacities of the IDT electrodes 182a, 183a are dominated by the number of couples of the electrode. Assuming the number of couples of the IDT electrode 182a to be n, and the electrode capacity of a couple of IDT electrode fingers to be C, the values of $C_1$, Ca, Cb and Cc can be expressed, respectively, as follows:

$$C_1 = n \times C$$

$$Ca = na \times C = C_1 \times na/n = C_1 \times na/(na+nb+nc)$$

$$Cb = nb \times C = C_1 \times nb/n = C_1 \times nb/(na+nb+nc)$$

$$Cc = nc \times C = C_1 \times nc/n = C_1 \times nc/(na+nb+nc)$$

Accordingly, from the capacity equivalent circuit diagram of FIG. 19, the total capacity $C_2$ can be expressed by the Expression 1, by using Ca, Cb, and Cc.

$$\text{Expression 1:} \quad C_2 = \frac{C_c C_b + C_b C_c + C_c C_a}{C_a + C_c}$$

$$= \frac{(n_a n_b + n_b n_c + n_c n_a) \times C_1}{(n_a + n_c) \times n}$$

For example, assuming that the number of couples of the divisional IDT electrodes 184a, 184b, and 184c are equal, i.e., na=nb=nc=n/3, the relation becomes $C_2=C_1\times\frac{1}{2}$, and the capacity of $C_2$ becomes half of that of $C_1$. By changing the number of couples na, nb, and nc of the divisional IDT electrodes 184a, 184b, and 184c, the total capacity $C_2$ of the IDT electrode 183a varies according to Expression 1 in the range of $C_1\times\frac{1}{4}<C_2<C_1$. Namely, the total capacity of the IDT electrode 183a can be controlled by the divisional ratio of the divisional IDT electrodes 184a, 184b, and 184c.

Also, in this case, the electric charges on the electrodes of the first, second, and third divisional IDT electrodes 184a, 184b, and 184c are not mutually cancelled, and the SAWs formed by the first, second, and third divisional IDT electrodes 184a, 184b, and 184c become the same phase. So that the second SAW resonator has the equivalent resonance characteristics to those of the first SAW resonator. Accordingly, by disposing the first SAW resonator and the second SAW resonator near to each other, they operate as the lateral mode combined resonance type filters in the same manner as in the conventional system.

As described above, according to the present Embodiment 5, the SAW filter having balanced type input and output shows excellent characteristics in the extra-band selectivity with narrow bandwidth, and also it can control the output impedance of the SAW filter by the electrode structure of IDT electrode which is formed by the divisional IDT electrode which is characterized by the present invention.

Figure 20:
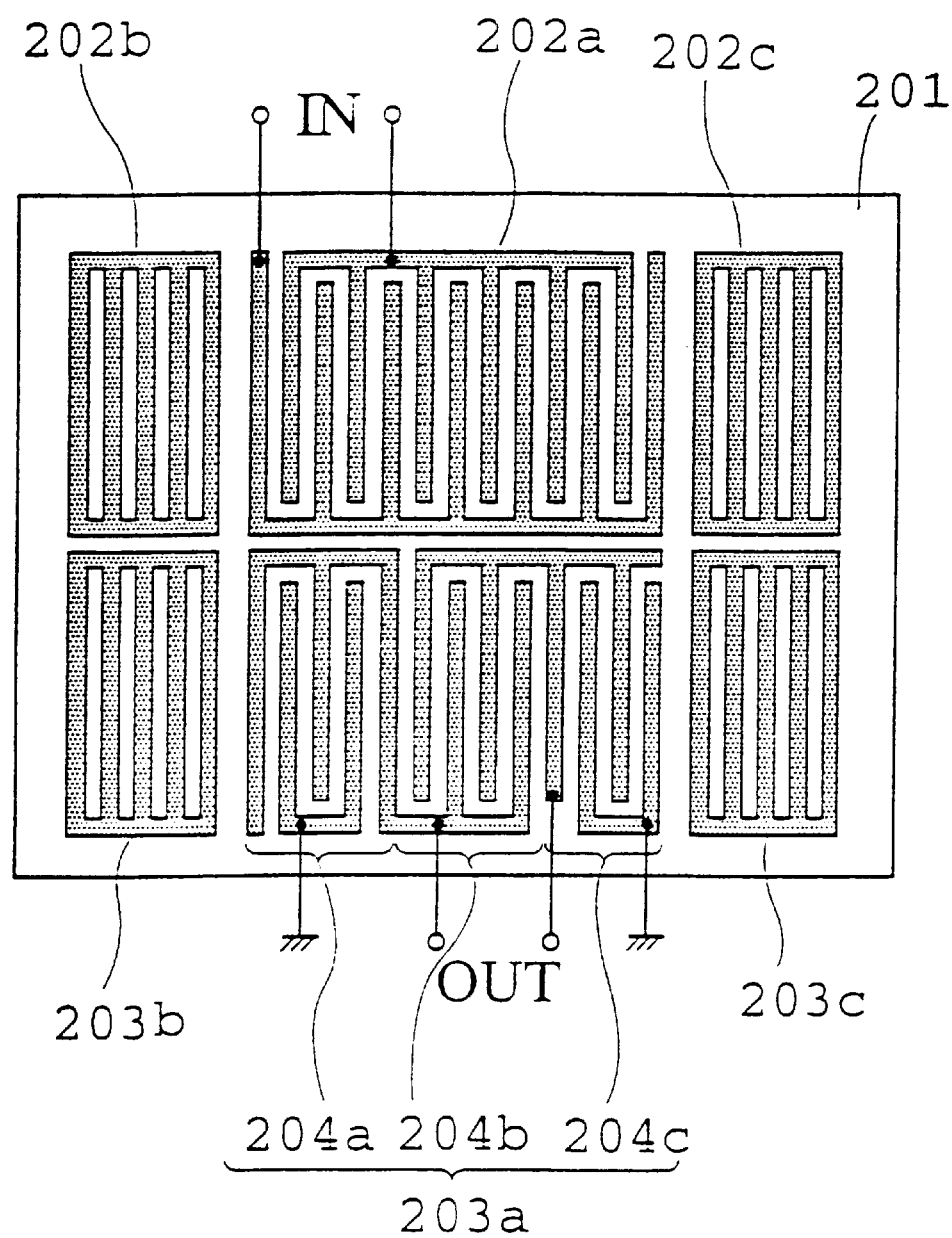
FIG. 20 is a constitution view showing another example of SAW filter in the fifth embodiment of the present invention.

In the fifth embodiment, description has been made on the IDT electrode 183a which constitutes the second SAW resonator, relating to the case where the first, second, and third divisional IDT electrodes 184a, 184b, and 184c which constitute the IDT electrode 183a are laid from left side to right side in order in the drawing, but the laying order may not be limited to the above but be from right side to left side as 184a, 184b, and 184c. The electrode pattern of the IDT electrode 183a may be inverted upside down. In such a case, as shown in FIG. 20, the IDT electrode 203a which constitutes the second SAW resonator on the piezoelectric substrate 201 is constituted by the connection of the three groups of first, second and third divisional IDT electrodes 204a, 204b and 204c. The first divisional IDT electrode 204a and the second divisional IDT electrode 204b are disposed in reverse mode, and the second divisional electrode 204b and the third divisional IDT electrode 204c are disposed in the same phase, the upper electrode of the first divisional IDT electrode 204a and the lower electrode of the second divisional IDT electrode 204b are connected, and the upper electrode of the second divisional IDT electrode 204b and the upper electrode of the third divisional IDT electrode 204c are connected to form an IDT electrode 203a which constitute the second SAW resonator. In FIG. 20, part 202a is an IDT electrode and parts 202b, 202c, 203c and 203b are reflector electrodes. Also, in FIG. 20, the divisional IDT electrodes 204a, 204b, and 204c are laid in order of 204a, 204b, and 204c from the left, but the order may be from the right. In these cases, the difference in IDT electrodes lies only in the electrode structures, and in respect to the characteristics of the SAW filter, the same effect as in the case of FIG. 18 is obtainable.

In Embodiment 5, the number of couples of the IDT electrode 182a and the total of the number of couples of the first, second and third divisional IDT electrodes 184a, 184b, and 184c, respectively, are equal. However, they need not be exactly same number of couples, and the ratio of the number of couples of the first, second and third divisional IDT electrodes 184a, 184b, and 184c can be optionally set. Further, the number of division of the IDT electrode 183a is set to be 3, but the number may be other than that number. Furthermore, though the electric terminal for the IDT electrode 182a is exemplified to be of balanced type, either one of the upper electrode or the lower electrode may be grounded to make unbalanced electric terminal. In such a case, a SAW filter having balanced-unbalanced terminals can be constituted. There has been adopted a constitution wherein the reflector electrodes 182b and 183b, and 182c and 183c are electrically separated, but the two members may be connected and grounded. Furthermore, though it is designed for the IDT electrode 183a constituted by the divisional IDT electrode 184a, 184b and 184c to constitute the second SAW resonator, it may constitute a first SAW resonator, or both of them, and in such a case there can be realized a SAW filter capable of controlling the impedance of both input and output sides.

(Embodiment 6)

Figure 21:
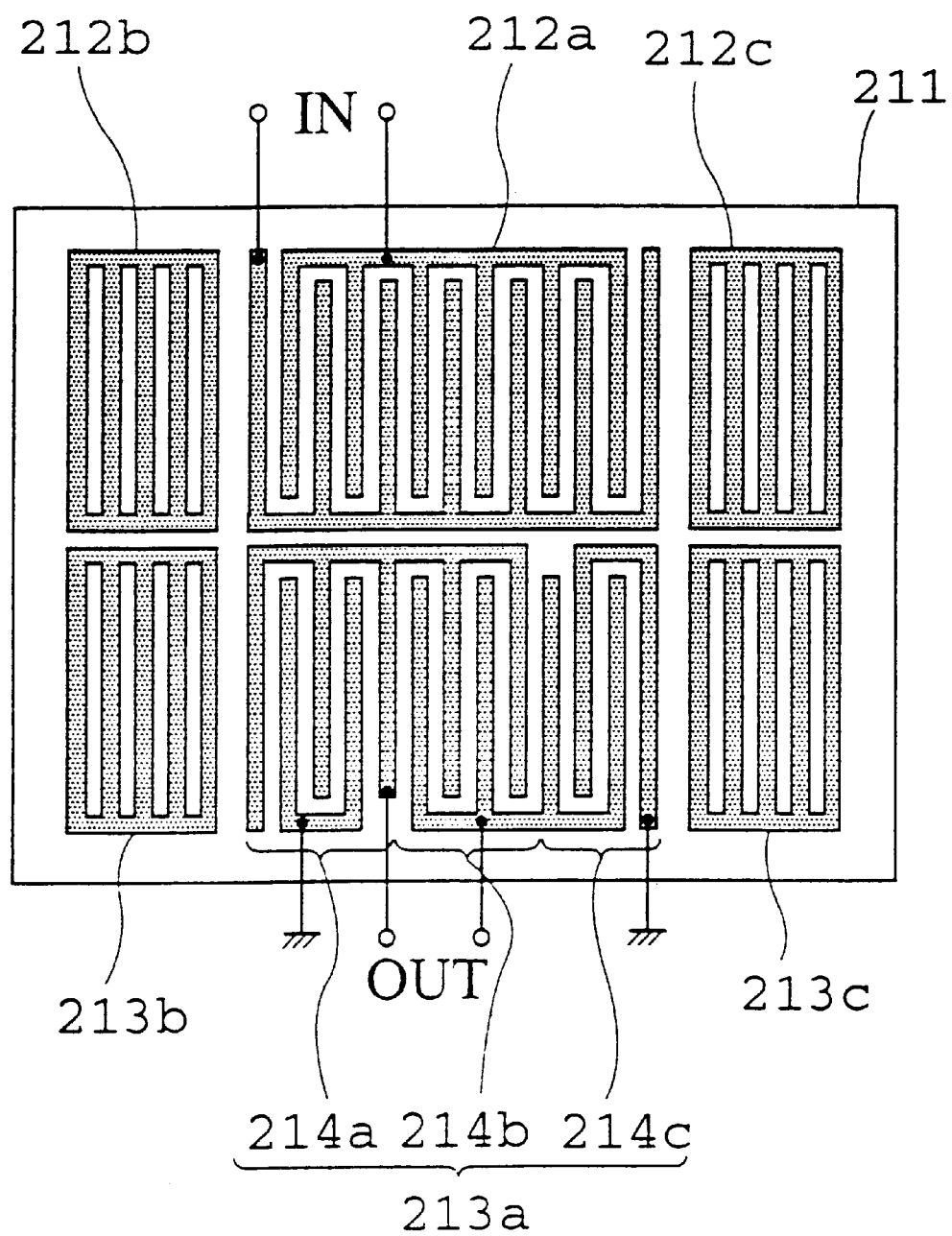
FIG. 21 is a constitution view showing another example of SAW filter in the sixth embodiment of the present invention.

FIG. 21 shows a constitution view of an electric pattern of SAW filter according to Embodiment 6 of the present invention.

In FIG. 21, the part 211 is a single crystal piezoelectric substrate. By constituting a periodic structure strip line form electrode pattern on said piezoelectric substrate 211, SAW can be excited. On the piezoelectric substrate 211 there is formed a first SAW resonator of energy stage type constituted by an IDT electrode 212a and reflector electrodes 212b, 212c. Also, on the piezoelectric substrate 211 there is formed a second SAW resonator of energy stage type constituted by an IDT electrode 213a and reflector electrodes 213b, 213c.

The IDT electrode 213a which constitutes the second SAW resonator is constituted by the connection of the three groups of first, second and third divisional IDT electrodes 214a, 214b and 214c. The first, second and third divisional IDT electrodes 214a, 214b and 214c are all disposed in the same phase, and the upper electrode of the first divisional IDT electrode 214a and the upper electrode of the second divisional IDT electrode 214b are connected, and by the connection of the lower electrode of the second divisional IDT electrode 214b and the lower electrode of the third divisional IDT electrode 214c, an IDT electrode 213a which constitutes the second SAW resonator is formed. And, as these two first and second SAW resonators are disposed in nearby relations and acoustic couple is formed therebetween, a SAW filter is constituted.

Furthermore, the upper electrode and lower electrode of the IDT electrode 212a are respectively connected to the balanced type input terminals IN. Also, the upper electrode of the first divisional IDT electrode 214a and the upper electrode of the second divisional IDT electrode 214b which constitute the IDT electrode 213a are connected to one side of the balanced type output terminal OUT, and the lower electrode of the second divisional IDT electrode 214b and the lower electrode of the third divisional IDT electrode 214c are connected to the other side of the balanced type output terminal OUT, and the lower electrode of the first divisional IDT electrode 214a and the upper electrode of the third divisional IDT electrode 214c are grounded to form the balanced type input and output terminals.

In the SAW filter constituted as above, the first SAW resonator has the same construction as that of the SAW resonator of the fifth embodiment, and the second SAW resonator is different from that of the fifth embodiment only in respect of the electrode pattern and its connection method of the IDT electrode 213a of the former from that of the IDT 183a of the latter. Even in this case, the electric charges on the divisional IDT electrodes 214a, 214b, and 214c are not mutually canceled but the SAWs formed by the divisional IDT electrodes 214a, 214b, and 214c are of the same phase, and the second SAW resonator has the same resonance characteristics as the first SAW resonator. Therefore, by disposing the first SAW resonator and the second SAW resonator nearby to each other, the SAW filter of this Embodiment 6 operates as a conventional lateral mode combined resonator type filter, in the same manner as in Embodiment 5. Additionally, the SAW filter having balanced type input and output possesses excellent characteristics of extra-band selectivity with narrow band, and can control the input and output impedance of SAW filter, thus giving the same effect as the SAW filter of the fifth embodiment.

In the sixth embodiment, the divisional IDT electrodes 214a, 214b, and 214c are designated as 214a, 214b, and 214c from the left side, but this sequence may be taken from the right side. Alternatively, the divisional number of IDT electrode 213a which is given as 3 may be set to any other number. The electric terminal of IDT electrode 212a which is exemplified as being of balanced type may be changed to unbalanced type electric terminal by grounding either the upper electrode or the lower electrode. In such a case, a SAW filter having balanced-unbalanced terminals can be constituted. Although the constitution is such that the reflector electrodes 212a and 213b, and 212c and 213c are electrically separated, the two members may be connected and grounded. Furthermore, though it is defined that the IDT electrode 213a constituted by the divisional IDT electrode 214a, 214b and 214c is to constitute the second SAW resonator, this may constitute a first SAW resonator, or both the first and second SAW resonators. In the latter case, a SAW filter capable of controlling the impedance's of both input and output can be realized.

(Embodiment 7)

In Embodiments 5 and 6, explanation has been given on the case of SAW filter of single stage constitution taken as examples. Such SAW filters may be used in multi-stage constitution.

Figure 22:
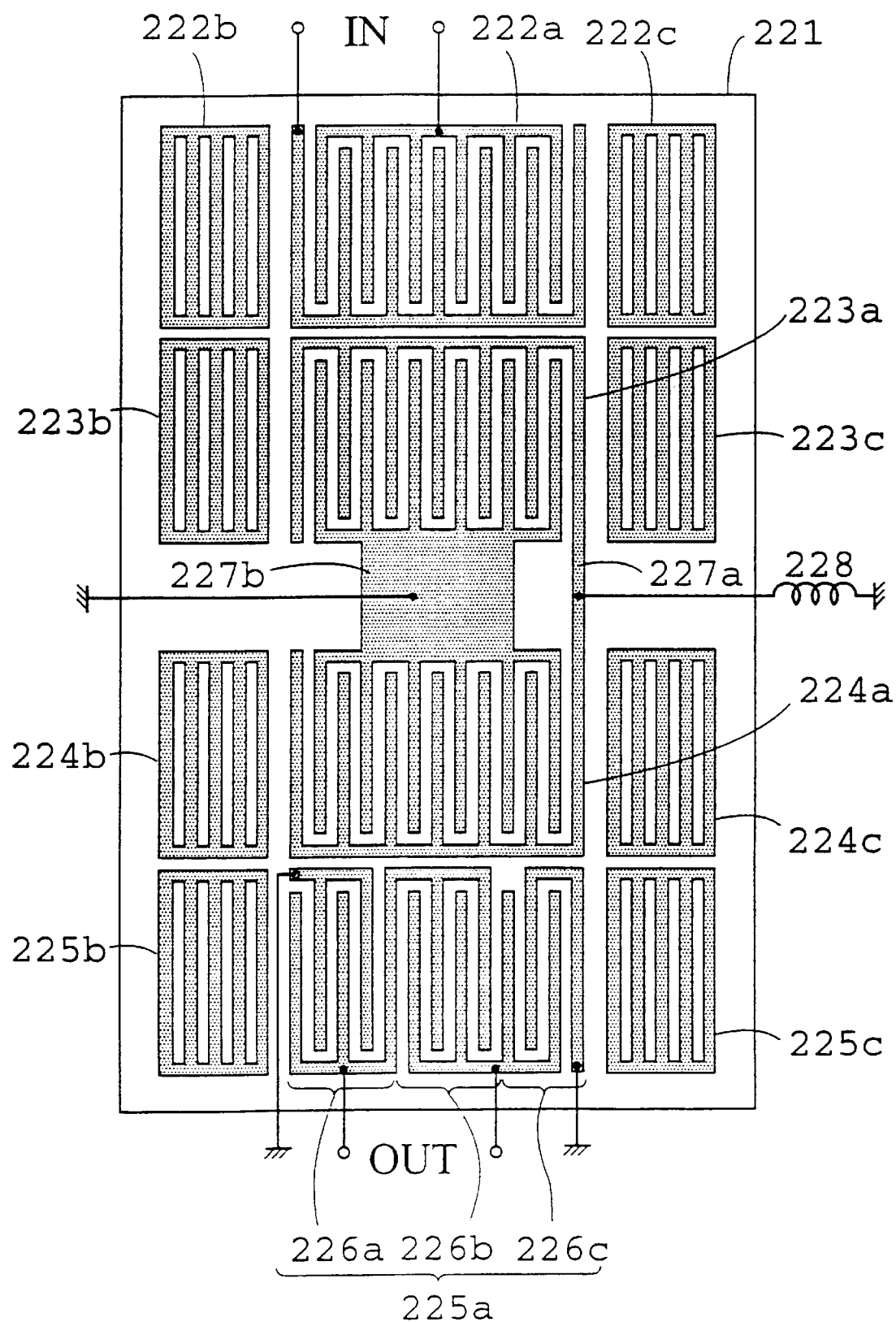
FIG. 22 is a constitution view showing another example of SAW filter in the seventh embodiment of the present invention.

FIG. 22 is an example of multi-stage constitution showing an electrode pattern constitution view of SAW filter according to Embodiment 7 of the present invention. In FIG. 22, the part 221 shows a single crystal piezoelectric substrate. When a plurality of SAW filters are vertically connected on the piezoelectric substrate 221 to constitute a multi-stage connection SAW filter, remarkable improvements are obtainable in the characteristics of rejection band and transition band, though some increase in the insertion loss occurs.

The two-stage vertically connected filter in FIG. 22 comprises a first SAW filter comprising a first SAW resonator constituted by an IDT electrode 222a and reflector electrodes 222b, 222c and a second SAW resonator constituted by an IDT electrode 223a and reflector electrodes 223b, 223c, which are disposed near to each other, and a second SAW filter comprising a third SAW resonator constituted by an IDT electrode 224a and reflector electrodes 224b, 224c and a fourth SAW resonator constituted by an IDT electrode 225a and reflector electrodes 225b, 225c, which are disposed near to each other, being formed on the piezoelectric substrate 221. The IDT electrode 225a constituting the fourth SAW resonator in the second SAW filter is composed by connecting the three groups of the first, second, and third divisional IDT electrodes 226a, 226b and 226c. The first divisional IDT electrode 226a and the second divisional IDT electrode 226b are disposed in reverse phase, and the second divisional IDT electrode 226b and the third divisional IDT electrode 226c are disposed in same phase. Then, the lower electrode of the first divisional IDT electrode 226a and the upper electrode of the second divisional IDT electrode 226b are mutually connected, and the lower electrode of the second divisional IDT electrode 226b and the lower electrode of the third divisional IDT electrode 226c are connected, by which an IDT electrode 225a which constitutes the fourth SAW resonator is formed. One of the leading out electrodes on the output side of the first stage SAW filter is connected to the opposite leading out electrode on the input side of the opposite next stage SAW filter by an inter-stage connecting electrode pattern 227a, and another first stage IDT electrode on the output side is connected to another next stage IDT electrode on the input side by an inter-stage connecting electrode pattern 227b, by which a two-stage SAW filter is formed.

Furthermore, the upper electrode and the lower electrode of the IDT electrode 222a which constitutes the first SAW resonator in the first SAW filter are connected respectively to the balanced type input terminal IN. Also, in the IDT electrode 225a which constitutes the fourth SAW resonator in the second SAW filter, the lower electrode of the first divisional IDT electrode 226a and the upper electrode of the second divisional IDT electrode 226b are connected to one side of the balanced type output terminal OUT, the lower electrode of the second divisional IDT electrode 226b and the lower electrode of the third divisional IDT electrode 225c are connected to the other side of the balanced type output terminal OUT, and the upper electrode of the first divisional IDT electrode 226a and the upper electrode of the third divisional IDT electrode 226c are grounded to form a balanced type input and output terminal.

However, there may be cases where the purported good transmission characteristics cannot be obtained by a simple vertical connection of the SAW filters, due to the non-matching of the input and output impedance's of stages. In such a case, a reactance element such as inductor may be connected as a matching element to the inter-stage connection electrode to make adjustment. Alternatively, there may be adopted such a constitution as to form a reactance element represented by a spiral inductor on the same piezoelectric substrate 221 or on a separate substrate and connect it to the inter-stage connection electrode, by which size reduction of the filter circuit can be easily realized without requiring extra space. With respect to the reactance element for adjustment, connection may be made to either one of the first inter-stage connection electrode pattern 227a or 227b, and other inter-stage electrode connecting pattern may be grounded. According to the experiment, as shown in FIG. 22, connection of the reactance element 228 to the inter-stage connection electrode pattern 227a proved to give improvement to the symmetry of filter transmission characteristics.

By the above constitution, the SAW filter having balanced type input and output in this Embodiment 7 shows narrow band characteristics, and by connecting two SAW filters by inter-stage connection electrode patterns 227a, 227b, the extra-band selectivity comes to show more acute characteristic than in the case of a single stage, and also it becomes possible to control the output impedance of the SAW filter.

In the seventh embodiment, in the IDT electrode 225a constituting the fourth SAW resonator in the second SAW filter, the first, second and third divisional IDT electrodes 226a, 226b, and 226c which constitute the IDT electrode 225a are designated as 226a, 226b, and 226c from the left side facing the drawing, but this sequence may be taken from the right side. The electrode pattern of the IDT electrode 225a may be reversed upside down.

In this Embodiment 7, the divisional number of IDT electrode 225a is given as 3, but it may be set to any other number. The electric terminal of IDT electrode 222a which is exemplified as being of balanced type may be changed to unbalanced type electric terminal by grounding either the upper electrode or the lower electrode. In such a case, a SAW filter having balanced-unbalanced terminals can be constituted. The IDT electrode 225a may be an IDT electrode 213a shown in Embodiment 6. In these cases, the IDT electrode 234a is different only in electrode constitution, and as to the SAW filter characteristic, the same effect as in FIG. 22 can be obtained. Though there is adopted such constitution that the reflector electrodes 222b and 223b, and 222c and 223c are electrically separated, the two members may be connected and grounded. Furthermore, though it is defined that the IDT electrode 225a constituted by the divisional IDT electrode 226a, 226b and 226c is to constitute the fourth SAW resonator, this may constitute a first SAW resonator, or both the first and fourth SAW resonators. In the latter case, a SAW filter capable of controlling the impedance's of both input and output can be realized. Also, the number of stages of SAW is shown as two stages, but the number may be larger, in which case the filter characteristics are acute, with more excellent extra-band selectivity.

(Embodiment 8)

Figure 23:
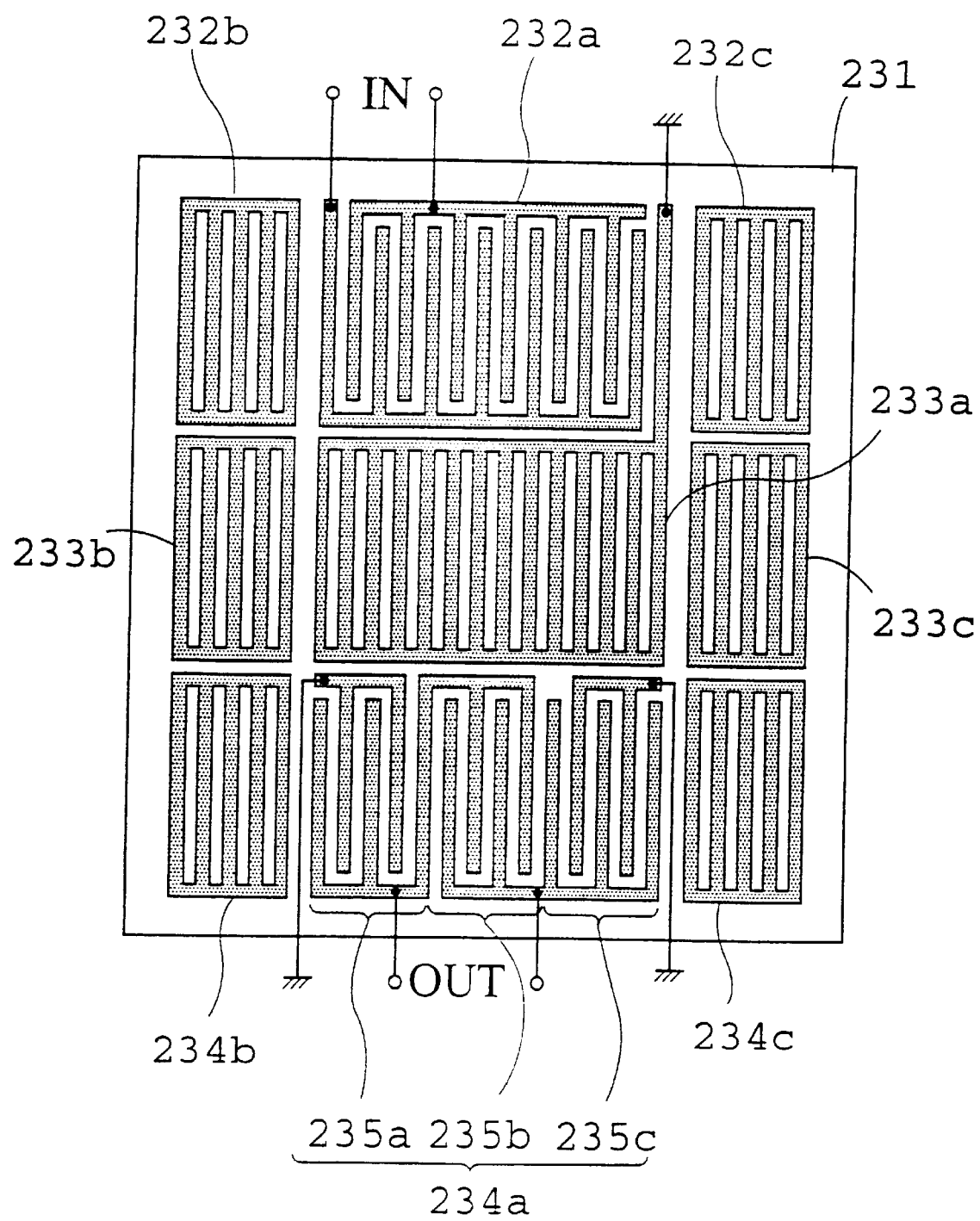
FIG. 23 is a constitution view showing another example of SAW filter in the eighth embodiment of the present invention.

FIG. 23 shows a constitution view of an electrode pattern of SAW filter according to Embodiment 8 of the present invention. In FIG. 23, the part 231 is a single crystal piezoelectric substrate. By forming an electrode pattern on said piezoelectric substrate 231, SAW can be excited. On the piezoelectric substrate 231 there is formed a first SAW resonator of energy strage type constituted by an IDT electrode 232a and reflector electrodes 232b, 232c. Also, on the piezoelectric substrate 231 there is formed a third SAW resonator constituted by an IDT electrode 234a and reflector electrodes 234b, 234c. The electrode part 233a of the second SAW resonator formed between the first SAW resonator and the third SAW resonator, accompanied with reflector electrodes 233b, 233c, has the same construction as the reflector electrode. In this way, even when the structure of the electrode part 233a of the second SAW resonator is not the IDT electrode structure but a periodic structure strip line electrode row, if the electrode period is the same, SAW can be propagated in exactly the same manner, so that the acoustic behaviors of the second SAW resonator disposed at the central part make no difference from those of the case of IDT electrode structure.

Furthermore, the IDT electrode 234a which constitute the third SAW is constituted by the connection of the three groups of first, second and third divisional IDT electrodes 235a, 235b and 235c. The first divisional IDT electrode 235a and the second divisional IDT electrode 235b are disposed in reverse phases; the second divisional IDT electrode 235b and the third divisional IDT electrode 235c are disposed in the same phase; the lower electrode of the first divisional IDT electrode 235a and the upper electrode of the second divisional IDT electrode 235b are connected; and the lower electrode of the second divisional IDT electrode 235b and the lower electrode of the third divisional IDT electrode 235c are connected to form an IDT electrode 234a which constitutes the third SAW resonator.

The above three SAW resonators are disposed in nearby relation with one another, and the bus bar electrodes of the mutually adjacent parts are electrically independent. The upper electrode and the lower electrode of IDT electrode 232a which constitute the first SAW resonator in the first SAW filter are connected respectively to the balanced type input terminal IN. Also, in the IDT electrode 234a which constitutes the third SAW resonator, the lower electrode of the first divisional IDT electrode 235a which constitutes the IDT electrode 234a and the upper electrode of the second divisional IDT electrode 235b are connected to one side of the balanced type output terminal OUT, and the lower electrode of the second divisional IDT electrode 235b and the lower electrode of the third divisional IDT electrode 235c are connected to the other side of the balanced type output terminal OUT, and the upper electrode of the first divisional IDT electrode 235a and the upper electrode of the third divisional IDT electrode 235c are grounded to form a balanced type input and output terminal, and the periodic structured strip line electrode line 233a in the second SAW resonator is grounded.

As described above, the SAW filter according to this Embodiment 8 is characterized by realizing a filter characteristic by disposing the three SAW resonators nearby in parallel with the direction of propagation of the SAW to make acoustic couple.

At this time, the SAW filter is a substitution of the IDT electrode 233a which constitutes the second SAW resonator in the SAW filter of the present invention for the IDT electrode in the SAW multi-mode filter of Japanese Patent Kokai Publication No. 8-51334 published by the present inventors, and it shows the same operation as that described in said Publication No. 8-51334. Namely, by making the SAW resonator in three stages, the filter can have wide band width, and characteristics excellent in extra-band selectivity, and also can control the output impedance of the SAW filter.

In the eighth embodiment, in the IDT electrode 234a constituting the third SAW resonator, the first, second and third divisional IDT electrodes 235a, 235b, and 235c which constitute the IDT electrode 234a are designated as 235a, 235b, and 235c from the left side facing the drawing, but this sequence may be taken from the right side. The electrode pattern of the IDT electrode 234a may be reversed upside down. The IDT electrode 234a may be the IDT electrode 213a of the constitution shown in Embodiment 6. In these cases, the IDT electrode 234a is different only in electrode constitution, and as to the SAW filter characteristic, the same effect as in FIG. 23 can be obtained.

Also, the divisional number of IDT electrode 234a is given as 3, but it may be set to any other number. The electric terminal of IDT electrode 232a which is exemplified as being of balanced type may be changed to unbalanced type electric terminal by grounding either the upper electrode or the lower electrode. In such a case, a SAW filter having balanced-unbalanced terminals can be constituted. Though there is adopted such constitution that the reflector electrodes 232b and 233b, and 232c and 233c are electrically separated, the two members may be connected and grounded. Furthermore, though it is defined that the IDT electrode 234a constituted by the divisional IDT electrode 235a, 235b and 235c is to constitute the third SAW resonator, this may constitute a first SAW resonator, or both the first and third SAW resonators. In the latter case, a SAW filter capable of controlling the impedance's of both input and output can be realized.

In this Embodiment 8, the IDT electrode 233a is described as being grounded through the electrode pattern provided in the space between the IDT electrode 232a and the reflector electrode 233c on the right side thereof. However, it may be grounded through the electrode pattern provided in the space between the IDT electrode 233a and the reflector electrode 233a on the left side thereof, or alternatively it may be grounded through the electrode pattern provided in the space between the IDT electrode 234a and either one of the reflector electrode 234b or 234c. Though there is adopted such constitution that the reflector electrodes 232b and 233b, and 232c and 233c are electrically separated on each SAW resonator, they may be respectively connected and grounded. Furthermore, the IDT electrode 233a may be grounded through any of the reflector electrodes 232b, 232c, 233b, 233c, 234b, and 234c. The IDT electrode 233a may be of the electrode structure of the same constitution as that of the IDT electrode 232a. In this case also, propagation of SAW is performed in the same manner, and the similar characteristic as that of the SAW filter of this Embodiment 8 is obtainable. Furthermore, though it is described that the divisional IDT electrode 234a is to constitute a third SAW resonator, it may be constituted by a first SAW resonator, or both of them. In the latter case, a SAW filter capable of controlling the impedance's of both input and output can be realized. Although the first to the third SAW resonators are shown to be of the same constitution, they need not necessarily be the same. The SAW filters of Embodiment 8 may be of two stage vertical connection, in which case the extra-band selectivity characteristic becomes further acute.

As to the piezoelectric substrate in the present invention, use of an ST cut crystal having excellent temperature characteristics is preferable, but there may be used as substrates $LiTaO_3$, $LiNbO_3$, $Li_2B_4O_7$, $La_3Ga_5SiO_{14}$ and the like. As an electrode material, use of relatively low density aluminum whose film thickness control is easy is preferable, but use of gold electrode is also possible.

Furthermore, the present invention is applicable to resonators using not only the SAW described above but also SSBW(Surface Skimming Balk Wave) which is one of the SAW or Pseudo surface waves, and the like.

What is claimed is:

1. A surface acoustic wave filter comprising first and third surface acoustic wave resonators each having a reflector electrode on both sides of an IDT electrode as an inter-digital transducer electrode, said resonators being disposed in positions in which the directions of propagation of the respective surface acoustic waves are parallel with each other, a plurality of strip line electrodes having substantially the same length as the crossing width of the electrode fingers of the IDT electrodes being disposed in parallel between said first and third surface acoustic wave resonators in the same electrode period as those of the first and third surface acoustic wave resonators, both end parts of said plural strip line electrodes being connected to one another by bus bar electrodes to form a second surface acoustic wave resonator comprising periodic structured electrode rows, said first, second, and third surface acoustic wave resonators being disposed nearby to one another to make an acoustic coupling, first and second leading out electrodes to constitute a part of a balanced type input terminal being formed in a gap between the reflector electrodes on both sides in an outside direction from both ends of an inside bus bar electrode of the IDT electrode of the first surface acoustic wave resonator, and third and fourth leading out electrodes to constitute a part of a balanced type output terminal being formed in a gap between the reflector electrodes on both sides in an outside direction from both ends of an inside bus bar electrode of the IDT electrode of the third surface acoustic wave resonator, thereby making balanced operation.

2. A surface acoustic wave filter according to claim 1, wherein said first and second leading out electrodes of said surface acoustic wave resonators are connected to make one input terminal of the balanced type input terminal, a bus bar electrode on the outside of the IDT electrode of said first surface acoustic wave resonator is made the other input terminal of the balanced type input terminal, said third and fourth leading out electrodes of said third surface acoustic wave resonator are connected to make one output terminal of the balanced type output terminal, and a bus bar electrode on the outside of the IDT electrode of said third surface acoustic wave resonator is made the other output terminal of the balanced type output terminal.

3. A multi-stage surface acoustic wave filter comprising a plurality of stages of the surface acoustic wave filters of claim 2 formed on a same piezoelectric substrate, said third and fourth leading out electrodes of the front stage surface acoustic wave filter being connected to the opposed first and second leading out electrodes of the surface acoustic wave filters of the next stage, respectively, with the remaining output side electrode of said front stage surface acoustic wave filter being connected to the remaining input side electrode of said next stage surface acoustic wave filter.

4. A surface acoustic wave filter according to claim 3, wherein said second surface acoustic wave resonator is of a construction possessing reflector electrodes on both sides of the IDT electrode, of substantially the same configurations as the first and third surface acoustic wave resonators, and wherein said IDT electrodes are grounded.

5. A multi-stage surface acoustic wave filter comprising:
   a plurality of stages of the surface acoustic wave filters of claim 2 formed on a same piezoelectric substrate,
   the third and fourth leading out electrodes of the front stage surface acoustic wave filter and the opposed leading out electrodes of the next stage, being connected by a first inter-stage connecting electrode having a wider width than the width of said leading out electrode on said piezoelectric substrate,
   another output side electrode and input side electrode of said front stage and next stage being connected by a second inter-stage connecting electrode having a wider width than the width of said leading out electrode, the first and second leading out electrodes of the first stage surface acoustic wave filter being connected by a wiring pattern having a line path width wider than the width of said leading out electrode formed on said piezoelectric substrate, a part of said wiring pattern being further expanded to form a connecting land for one of said balanced type input terminals, and an outside bus bar electrode of the IDT electrode of said first stage surface acoustic wave filter being outwardly expanded to form the other connecting land of balanced type input terminals, and the third and fourth leading out electrodes of the last stage surface acoustic wave filter being connected by a wiring pattern having a line path width wider than the width of said leading out electrode formed on said piezoelectric substrate, and a part of said wiring pattern being further expanded to form a connecting land for one of the balanced type output terminals, and a part of said outside bus bar electrode on the outside of the IDT electrode of said last stage surface acoustic wave filter being outwardly expanded to form a connecting land for the other of the balanced type output terminals.

6. A multi-stage surface acoustic wave filter according to claim 5, wherein at least one of the first and the second inter-stage connecting electrodes is connected through a reactance element.

7. A multi-stage surface acoustic wave filter according to claim 5, wherein, of the first and the second inter-stage connecting electrodes, one is grounded and the other is grounded through a reactance element.

8. A multi-stage surface acoustic wave filter according to claim 5, wherein said first inter-stage connecting electrode is grounded through the reactance element, and the second inter-stage connecting electrode is grounded.

9. A surface acoustic wave filter according to claim 5, wherein said second surface acoustic wave resonator is of a construction possessing reflector electrodes on both sides of the IDT electrode, of substantially the same configurations as the first and third surface acoustic wave resonators, and wherein said IDT electrodes are grounded.

10. A surface acoustic wave filter according to claim 1, wherein said first and second leading out electrodes of said surface acoustic wave resonators are connected by a wiring pattern having a line path width wider than the width of the leading out electrode formed on the piezoelectric substrate, a part of said wiring pattern is further expanded to form a connection land of one part of the balanced type input terminals, and a bus bar electrode on the outside of the IDT electrode of the first surface acoustic wave resonators is expanded in the external direction to form a connection land of the other part of the balanced type input terminals, and the third and the fourth leading out electrodes of said third surface acoustic wave resonators are connected by a wiring pattern having a line path width wider than the width of said leading out electrode, a part of said wiring pattern is further expanded to form a connection land of one part of the balanced type output terminals of the balanced type output terminal, and a bus bar electrode on the outside of the IDT electrode of the third surface acoustic wave resonators is expanded in the external direction to form a connection land of the other part of the balanced type input terminals.

11. A surface acoustic wave filter according to claim 1, wherein said second surface acoustic wave resonator is of a construction possessing reflector electrodes on both sides of the IDT electrode, of substantially the same configurations as the first and third surface acoustic wave resonators, and wherein said IDT electrodes are grounded.

12. A surface acoustic wave filter on a piezoelectric substrate comprising a first surface acoustic wave resonator having reflector electrodes on both sides of a first electrode for exciting a surface acoustic wave and a third surface acoustic wave resonator having reflector electrodes on both sides of the third electrode being disposed with respect to each other in the positions in which a propagation direction of the respective surface acoustic waves becomes parallel, a first bus bar electrode included in said first electrode and a third bus bar electrode included in said third electrode being mutually separated and disposed in opposed manner, a second surface acoustic wave resonator having a plurality of strip line electrodes, an electrode for connecting the one end parts of both ends of those plural strip line electrodes, and electrodes for connecting the other end parts, being formed between the opposed first bus bar electrode and the third bus bar electrode, said first surface acoustic wave resonator and said third surface acoustic wave resonator being disposed nearby to each other and to the second surface acoustic wave resonator and acoustically coupled, one input terminal of balanced type input terminals, said one input terminal being constructed by using an electrical connection between leading out electrodes led out from at least two places on said first bus bar electrode, and one output terminal of balanced type output terminals, said one output terminal being constructed by using an electrical connection between leading out electrodes led out from at least two places on said third bus bar electrode, thereby performing balanced operation.

13. A surface acoustic wave filter on a piezoelectric substrate comprising first, second and third surface acoustic wave resonators each having a reflector electrode on both sides of an IDT electrode an as inter-digital transducer electrode, said resonators being disposed on a piezoelectric substrate in positions nearby to one another in which directions of propagation of the respective surface acoustic waves are parallel with each other to make an acoustic wave coupling, the adjacent bus bar electrodes between said surface acoustic wave resonators being electrically separated, and all said IDT electrodes of said second surface acoustic wave resonators provided between said first and third resonators being grounded, wherein an electrode finger crossing width of IDT electrodes constituting the first and third surface acoustic wave resonators is W1, and an electrode finger crossing width of the IDT electrodes of the second surface acoustic wave resonator is W2, and the relative size of W1 to W2 is set to 1<W2/W1.

14. A surface acoustic wave filter on a piezoelectric substrate comprising first and third surface acoustic wave resonators each having a reflector electrode on both sides of an IDT electrode as an inter-digital transducer electrode, said resonators being disposed on a piezoelectric substrate in positions in which directions of propagation of the respective surface acoustic waves are parallel with each other, and a plurality of strip line electrodes being disposed in parallel between said first and third surface acoustic wave resonators in the same electrode period as those of the first and third surface acoustic wave resonators, said plural strip line electrodes being connected to one another by bus bar electrodes to form a second surface acoustic wave resonator having periodic structured electrode rows, said first and third surface acoustic wave resonators being disposed nearby to said second surface acoustic wave resonator to make an acoustic coupling, and the adjacent bus bar electrodes between said surface acoustic wave resonators being electrically separated, and all periodic structured electrodes of said second surface acoustic wave resonators being grounded, wherein an electrode finger crossing width of IDT electrodes constituting the first and third surface acoustic wave resonators is W1, and a strip line length of said periodic structured electrode rows constituting the second surface acoustic wave resonator is W2, and the relative size of W1 to W2 is set to 1<W2/W1.

15. A surface acoustic wave filter according to claim 14, wherein the relative size of W1 to W2 is set to 1<W2/W1≦1.3.

16. A multi-stage surface acoustic wave filter wherein a plurality of surface acoustic wave filters according to claim 14 are cascade connected by first and second inter-stage electrode patterns formed on the piezoelectric substrate.

17. A multi-stage surface acoustic wave filter according to claim 16, wherein, of the first and second inter-stage connected electrode patterns, one is directly grounded, and the other is grounded through a reactance element.

18. A multi-stage surface acoustic wave filter according to claim 16, wherein the first surface acoustic wave resonator IDT electrode of the front stage surface acoustic wave filter is connected to the balanced type input terminal, and the third surface acoustic wave resonator IDT electrode of the back stage surface acoustic wave filter is connected to the balanced type output terminal.

* * * * *

UNITED STATES PATENT AND TRADEMARK OFFICE
CERTIFICATE OF CORRECTION

PATENT NO. : 6,348,845 B2
DATED : February 19, 2002
INVENTOR(S) : Hiroyuki Nakamura et al.

It is certified that error appears in the above-identified patent and that said Letters Patent is hereby corrected as shown below:

Title page,
Item [56], References Cited, U.S. PATENT DOCUMENTS, change "3-119316" to -- 3-119816 --

Signed and Sealed this

Eighteenth Day of February, 2003

JAMES E. ROGAN
*Director of the United States Patent and Trademark Office*